United States Patent
Kim et al.

(10) Patent No.: US 9,349,633 B2
(45) Date of Patent: May 24, 2016

(54) SEMICONDUCTOR DEVICES AND METHODS OF MANUFACTURING THE SAME

(71) Applicant: SAMSUNG ELECTRONICS CO., LTD., Suwon-Si, Gyeonggi-Do (KR)

(72) Inventors: Dae-Ik Kim, Hwaseong-si (KR); Sung-Eui Kim, Suwon-si (KR); Hyoung-Sub Kim, Seongnam-si (KR); Sung-Kwan Choi, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/563,269

(22) Filed: Dec. 8, 2014

(65) Prior Publication Data
US 2015/0162335 A1 Jun. 11, 2015

(30) Foreign Application Priority Data
Dec. 6, 2013 (KR) .......................... 10-2013-0151158

(51) Int. Cl.
*H01L 21/768* (2006.01)
*H01L 27/108* (2006.01)
*H01L 49/02* (2006.01)

(52) U.S. Cl.
CPC ........ *H01L 21/768* (2013.01); *H01L 27/10814* (2013.01); *H01L 27/10823* (2013.01); *H01L 27/10852* (2013.01); *H01L 27/10876* (2013.01); *H01L 27/10885* (2013.01); *H01L 28/91* (2013.01)

(58) Field of Classification Search
CPC .................. H01L 27/10814; H01L 27/10823; H01L 27/10852; H01L 27/10876; H01L 27/10885; H01L 28/91
See application file for complete search history.

(56) References Cited

U.S. PATENT DOCUMENTS

| 7,935,998 | B2 * | 5/2011 | Cheng | H01L 21/84 257/296 |
|---|---|---|---|---|
| 8,309,449 | B2 | 11/2012 | Jeong et al. | |
| 9,230,853 | B2 * | 1/2016 | Yu | H01L 21/76879 |
| 2004/0016957 | A1 * | 1/2004 | Wu | H01L 27/10811 257/316 |
| 2007/0181926 | A1 * | 8/2007 | Ko | H01L 27/10888 257/296 |
| 2007/0235801 | A1 * | 10/2007 | Cheng | H01L 21/84 257/330 |
| 2008/0169494 | A1 * | 7/2008 | Cheng | H01L 21/84 257/302 |
| 2009/0085083 | A1 * | 4/2009 | Shin | H01L 21/76804 257/297 |
| 2010/0164114 | A1 * | 7/2010 | Kang | H01L 21/76816 257/773 |
| 2011/0024811 | A1 | 2/2011 | Kim | |
| 2012/0012911 | A1 | 1/2012 | Jeong | |

(Continued)

FOREIGN PATENT DOCUMENTS

KR 10-2011-0086357 7/2011

*Primary Examiner* — Allan R Wilson
(74) *Attorney, Agent, or Firm* — F. Chau & Associates, LLC

(57) ABSTRACT

A method of manufacturing a semiconductor device includes forming an isolation layer on a substrate, where an active pattern is defined, forming an insulating interlayer on the active pattern of the substrate and the isolation layer, removing portions of the insulating interlayer, the active pattern and the isolation layer to form a first recess, forming a first contact in the first recess on a first region of the active pattern exposed by the first recess, removing portions of the active pattern and the isolation layer in the first recess by performing an isotropic etching process, to form an enlarged first recess, and filling the enlarged first recess to form a first spacer that surrounds a sidewall of the first contact.

16 Claims, 26 Drawing Sheets

(56) References Cited

U.S. PATENT DOCUMENTS

| | | |
|---|---|---|
| 2012/0153481 A1 | 6/2012 | Ahn |
| 2012/0228702 A1 | 9/2012 | Wu |
| 2012/0326214 A1 | 12/2012 | Cho |
| 2013/0094315 A1 | 4/2013 | Patterson et al. |
| 2014/0061939 A1* | 3/2014 | Yu .................... H01L 21/76816 257/774 |

* cited by examiner

FIRST
DIRECTION
⊗ → SECOND
   DIRECTION

SEMICONDUCTOR DEVICES AND METHODS OF MANUFACTURING THE SAME

CLAIM OF PRIORITY

This application claims priority under 35 USC §119 from Korean Patent Application No. 10-2013-0151158, filed on Dec. 6, 2013 in the Korean Intellectual Property Office (KIPO), and all the benefits accruing therefrom, the contents of which are herein incorporated by reference in their entirety.

BACKGROUND

1. Technical Field

Exemplary embodiments are directed to semiconductor devices and methods of manufacturing the semiconductor devices.

2. Discussion of the Related Art

In a conventional method of manufacturing semiconductor memory devices, spacers may be formed on sidewalls of a bit line and a bit line contact. The spacers may protect and isolate the bit line and the bit line contact. Further, a capacitor contact may be formed between the spacers. Recently, as the degree of integration semiconductor devices increases, a distance between adjacent bit lines decreases. Therefore, a width of spacer disposed on sidewalls of the bit line or a bit line contact may also decrease. However, during processes for manufacturing a semiconductor device, such as an etching process to form a recess to receive the capacitor contact, the spacer may be over-etched or removed, thereby damaging the bit line or the bit line contact.

SUMMARY

Exemplary embodiments provide a semiconductor device having an improved reliability.

Exemplary embodiments provide a method of manufacturing a semiconductor device having an improved reliability.

According to some exemplary embodiments, there is provided a method of manufacturing a semiconductor device. In the method, an isolation layer is formed on a substrate, in which an active pattern is defined. An insulating interlayer is formed on the active pattern of the substrate and the isolation layer. Portions of the insulating interlayer, the active pattern and the isolation layer are removed to form a first recess. A first contact is formed in the first recess on a first region of the active pattern exposed by the first recess. Portions of the active pattern and the isolation layer are removed by performing an isotropic etching process, to form an enlarged first recess. The enlarged first recess is filled to form a first spacer that surrounds a sidewall of the first contact.

In exemplary embodiments, a bit line may be further formed on the first contact and the insulating interlayer. The bit line may extend parallel to a top surface of the substrate in a first direction. A plurality of second spacers may be formed to surround a sidewall of the bit line.

In exemplary embodiments, forming the enlarged first recess may be performed after forming the first contact and forming the bit line.

In exemplary embodiments, forming the enlarged first recess may be performed before forming the first contact and forming the bit line.

In exemplary embodiments, the first spacer may have a first width in a second direction perpendicular to the first direction, the second spacer may have a second width in the second direction, and the first width may greater than or equal to the second width.

In exemplary embodiments, forming the first spacer may include forming a first insulation layer on an inner wall of the enlarged first recess, a sidewall of the first contact, and a top surface of the insulating interlayer, forming a second insulation layer on the first insulation layer, and removing upper portions of the first insulation layer and the second insulation layer.

In exemplary embodiments, the first insulation layer may include silicon oxide, and the second insulation layer may include silicon nitride.

In exemplary embodiments, portions of the insulating interlayer, the active pattern and the isolation layer are removed by an anisotropic etching process to form a second recess between the second spacers, and portions of the insulating interlayer, the active pattern and the isolation layer are removed by an isotropic etching process, to enlarge the second recess. The enlarged second recess may expose a second region of the active pattern.

In exemplary embodiments, an etching solution used by the isotropic etching process has an etch rate with respect to the silicon nitride that may be less than the etch rate with respect to the silicon oxide.

In exemplary embodiments, the enlarged second recess may be filled to form a second contact. A capacitor may be formed to be electrically connected to the second contact.

According to some exemplary embodiments, there is provided a semiconductor device including a substrate, a first contact, a bit line, a first spacer and a second spacer. The substrate includes an active pattern defined by an isolation layer. A first contact is disposed on the active pattern. A bit line disposed on the first contact extends parallel to a top surface of the substrate in a first direction. A first spacer surrounds a sidewall of the first contact. The first spacer has a first width in a second direction perpendicular to the first direction. The second spacer surrounds a sidewall of the bit line. The second spacer has a second width that is less than or equal to the first width.

In exemplary embodiments, the first spacer may include a first insulation layer pattern on the sidewall of the first contact and a top surface of the active pattern, the first insulation layer including silicon oxide, and a second insulation layer pattern on the first insulation pattern, the second insulation layer including silicon nitride.

In exemplary embodiments, the second spacer may include a third insulation layer pattern on the sidewall of the bit line and a top surface of the first spacer, a fourth insulation layer pattern on a sidewall of the third insulation layer pattern, and a fifth insulation layer pattern on a sidewall and a top surface of the fourth insulation layer pattern.

In exemplary embodiments, the second spacer may include a third insulation layer pattern on the sidewall of the bit line and a top surface of the first spacer, a fourth insulation layer pattern spaced apart from the third insulation layer pattern in the second direction, a fifth insulation layer on the third insulation layer pattern and the fourth insulation layer pattern, and a void defined by a sidewall and a top surface of the third insulation layer pattern, a sidewall of the fourth insulation layer pattern and a bottom surface of the fifth insulation layer pattern.

According to some exemplary embodiments, there is provided a method of manufacturing a semiconductor device. In the method, portions of an insulating interlayer, an active pattern and an isolation layer on a substrate are removed to form a first recess. A first contact is formed in the first recess on a first region of the active pattern exposed by the first recess. A bit line is formed on the first contact and the insulating interlayer. The bit line extends parallel to a top surface of the substrate in a first direction. Portions of the active pattern and the isolation layer in the first recess are removed by performing an isotropic etching process to form an enlarged first recess. The enlarged first recess is filled to form a first spacer that surrounds a sidewall of the first contact. A plurality of second spacers are formed that surround a sidewall of the bit line.

In exemplary embodiments, the isolation layer is formed on a substrate, in which the active pattern is defined, and the insulating interlayer is formed on the active pattern of the substrate and the isolation layer.

In exemplary embodiments, filling the enlarged first recess to form the first spacer may include forming a first insulation layer on an inner wall of the enlarged first recess, a sidewall of the first contact, and a top surface of the insulating interlayer, forming a second insulation layer on the first insulation layer, and removing upper portions of the first insulation layer and the second insulation layer. The method may further include removing portions of the insulating interlayer, the active pattern and the isolation layer by an anisotropic etching process to form a second recess, and removing portions of the insulating interlayer, the active pattern and the isolation layer by an isotropic etching process to enlarge the second recess. An etching solution used by the isotropic etching process may have an etch rate with respect to the second insulation layer that is less than the etch rate with respect to the first insulation layer.

In exemplary embodiments, forming the enlarged first recess may be performed after forming the first contact and forming the bit line.

In exemplary embodiments, forming the enlarged first recess may performed before forming the first contact and forming the bit line.

In exemplary embodiments, the first spacer may have a first width in a second direction perpendicular to the first direction, the second spacer may have a second width in the second direction, and the first width may be greater than or equal to the second width.

DETAILED DESCRIPTION

Figure 1:
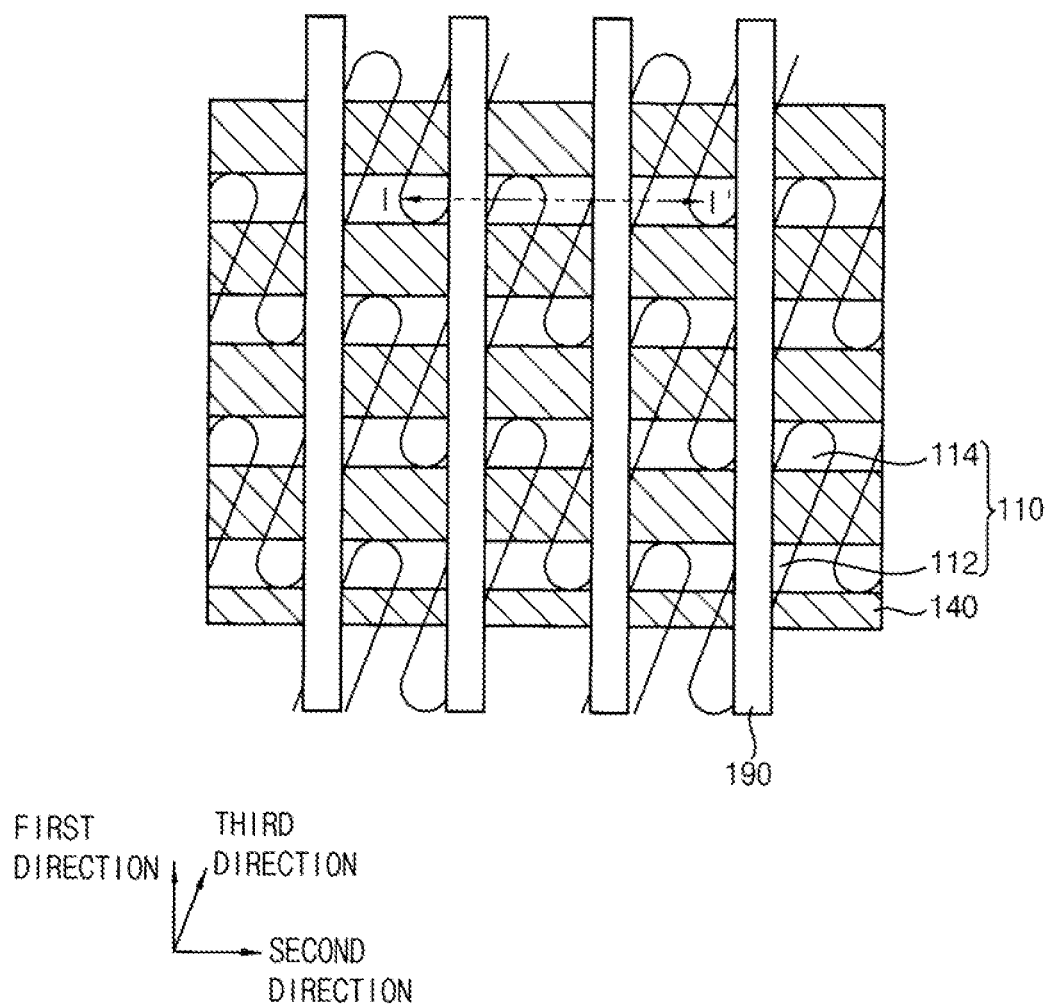
FIG. 1 is a plan view of a semiconductor device in accordance with some exemplary embodiments.

Various exemplary embodiments will be described more fully hereinafter with reference to the accompanying drawings, in which some exemplary embodiments are shown. Exemplary embodiments may, however, be embodied in many different forms and should not be construed as limited to those set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, exemplary embodiments will be explained in detail with reference to the accompanying drawings.

Figure 2:
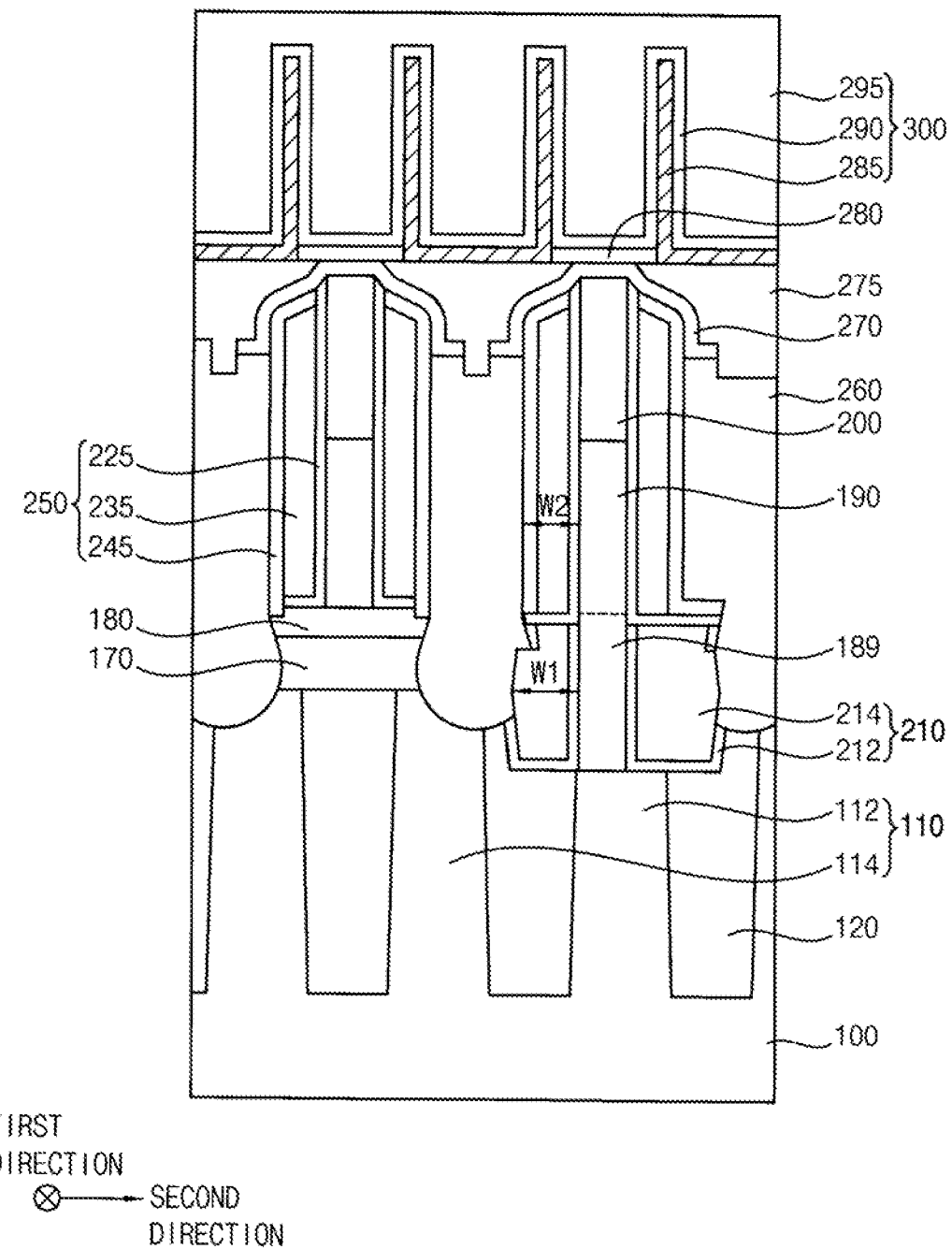
FIG. 2 is a cross-sectional view of a semiconductor device in accordance with some exemplary embodiments.

FIG. 1 is a plan view of a semiconductor device in accordance with some exemplary embodiments, and FIG. 2 is a cross-sectional view along line I-I' of FIG. 1.

Referring to FIGS. 1 and 2, a semiconductor device may include a substrate 100 that includes an active pattern 110, a gate structure, a bit line 190 and a capacitor 300.

The gate structure may be buried at an upper portion of the substrate 100, and the bit line 190 extending in a first direction, spacers 210 and 250 surrounding the bit line 190 and a hard mask 200 may be disposed on the substrate 100. Further, the capacitor 300 may be disposed above the bit line 190.

The substrate 100 may include a semiconductor, such as silicon, germanium, silicon-germanium, silicon-on-insulator (SOI), or germanium-on-insulator (GOI).

An isolation layer 120 that includes an insulation material such as silicon oxide may be disposed on the substrate 100. In this case, an upper portion of the substrate 100 surrounded by the isolation layer 120 may be defined as the active pattern 110. In exemplary embodiments, a plurality of active patterns 110 may be substantially parallel to a top surface of the substrate 100, spaced apart in the first direction and a second direction substantially perpendicular to the first direction. Each of the active patterns 110 may extend in a third direction obliquely oriented with respect to the first direction.

Figure 7:
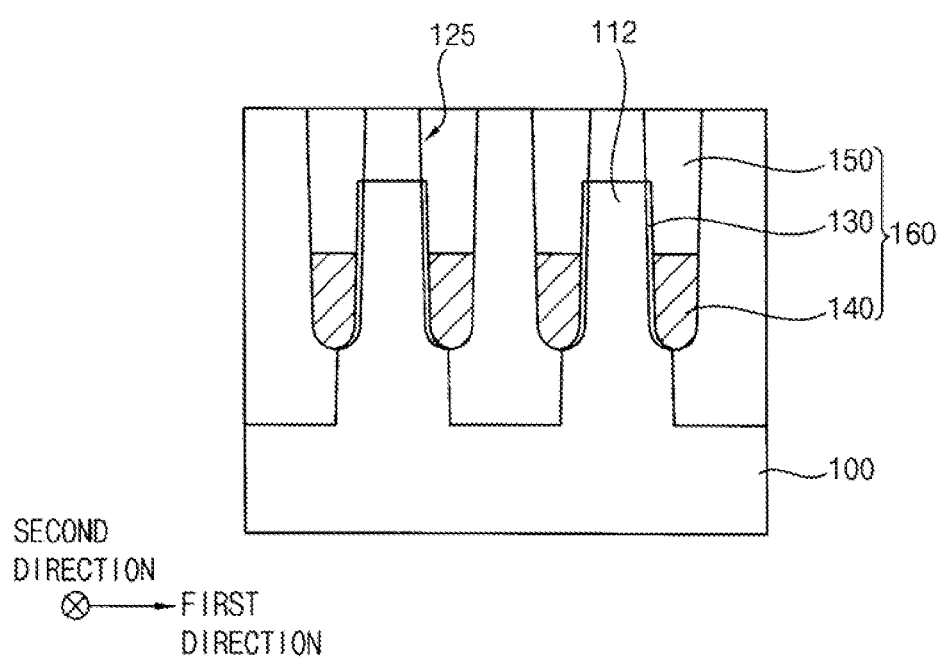

The gate structure disposed at the upper portion of the substrate 100 may include a gate electrode 140, a gate insulation layer pattern and a capping layer pattern (See FIG. 7). The gate electrode 140 may extend in the second direction. In exemplary embodiments, a plurality of gate electrodes 140 may be spaced apart from each other in the first direction. Further, the gate insulation layer pattern may be disposed between the active pattern 110 and the gate electrode 140, and the capping layer pattern may be disposed on the gate electrode 140.

In exemplary embodiments, at least one of gate structures may be disposed to correspond to single active pattern 110. For example, a single active pattern 110 may correspond to a pair of gate structures which may be spaced apart from each other in the first direction. Therefore, the active pattern 110 may be divided into a first region 112 between the pair of gate structures and second regions 114 disposed at outer portions of the active pattern 110.

A first insulating interlayer 170 and a second insulating interlayer 180 may be sequentially stacked on the active pattern 110, the isolation layer 120 and the gate structure, and under the bit line 190. For example, the first insulating interlayer 170 may include an oxide, such as silicon oxide, and the second insulating interlayer 180 may include a nitride, such as silicon nitride.

The bit line 190 may extend in the first direction. In exemplary embodiments, a plurality of bit lines 190 may be spaced apart in the second direction. For example, the bit line 190 may have a single layered structure or a multi layered structure that includes doped polysilicon and/or a metal, such as tungsten.

A first contact 189 may be disposed through the first and second insulating interlayers 170 and 180. Further, the first contact 189 may be disposed between the first region 112 of the active pattern 110 and the bit line 190. For example, the first contact 189 may include a conductive material, such as doped polysilicon. The first contact 189 may serve as a bit line contact which may electrically connect the bit line 190 with the active pattern 110.

The hard mask 200 may be disposed on the bit line 190. For example, the hard mask 200 may include an insulation material, such as silicon nitride.

The first spacer 210 and the second spacer 250 may be disposed on the sidewalls of the bit line 190, the first contact 189 and the hard mask 200.

The first spacer 210 may surround the sidewall of the first contact 189. The first spacer 210 may be wider in a direction parallel to the top surface of the substrate 100. In exemplary embodiments, the first spacer 210 may have a first width W1 in the second direction. In particular, the first width W1 may be a maximum at a central portion of the first spacer 210. Further, a top surface of the first spacer 210 may be lower than a top surface of the second insulating interlayer 180.

The first spacer 210 may include a first insulation layer pattern 212 and a second insulation layer pattern 214. In exemplary embodiments, the first insulation layer pattern 212 may contact the sidewall of first contact 189, a top surface of the active pattern 110 and a top surface of isolation layer 120, and the second insulation layer pattern 214 may surround the first insulation layer pattern 212. For example, the first insulation layer pattern 212 may include an oxide, such as silicon oxide, and the second insulation layer pattern 214 may include a nitride, such as silicon nitride.

The second spacer 250 may be disposed on sidewalls of the bit line 190 and the hard mask 200. In exemplary embodiments, the second spacer 250 may extend in the first direction along with the bit line 190. The second spacer 250 may protect and isolate the bit line 190. The second spacer 250 may have a second width W2 in the second direction which may be substantially the same as or less than the first width W1 of the first spacer 210.

The second spacer 250 may include a third insulation layer pattern 225, a fourth insulation layer pattern 235 and a fifth insulation layer pattern 245. The third insulation layer pattern 225, the fourth insulation layer pattern 235 and the fifth insulation layer pattern 245 may be sequentially disposed on the sidewall of the bit line 190. For example, the third insulation layer pattern 225 may include a nitride, such as silicon nitride, the fourth insulation layer pattern 235 may include an oxide, such as silicon oxide, and the fifth insulation layer pattern 245 may include a nitride, such as silicon nitride.

The capacitor 300 may be disposed above the hard mask 200. In exemplary embodiments, a plurality of capacitors 300 may be arranged in the first direction and the second direction, and each of the capacitors 300 may correspond to the second region 114 of the active pattern 100.

The capacitor 300 may include a lower electrode 285, a dielectric layer 290 and an upper electrode 295. In exemplary embodiments, the lower electrode 285 may have a U-shape to increase an area of the dielectric layer 290. For example, the dielectric layer 290 may include a high k-dielectric material which may have a dielectric constant larger than those of silicon oxide or silicon nitride. The upper electrode 295 may include a metal, a metal nitride or doped polysilicon.

In addition, the lower electrode 285 of the capacitor 300 may pass through an etch stop layer 280 and a sixth insulation layer pattern 270 to be electrically connected to the second region 114 of the active pattern 110 through a second contact 260 and a third contact 275. That is, the second contact 260 and the third contact 275 may serve as a capacitor contact.

The second contact 260 is disposed between adjacent second spacers 250 and may directly contact the second region 114 of the active pattern 110. A lower portion of the second contact 260 may be wider than an upper portion of the second contact 260. In particular, the lower portion of the second contact 260 may have a bulbous shape. That is, an interface between the lower portion of the second contact 260 and the second region 114 of the active pattern and an interface between the lower portion of the second contact 260 and the first spacer 210 may be curved. Therefore, a contact area between the second contact 260 and the active pattern 110 may increase, so that an electrical resistance between the second contact 260 and the active pattern 110 may decrease.

According to exemplary embodiments, the semiconductor device may include the first contact 189, the first spacer 210 surrounding the first contact 189, the bit line 190 and the second spacer 252 surrounding the bit line 190. Further, the first width W1 of the first spacer 210 may be substantially the same as or greater than the second width W2 of the second spacer 250. That is, the first spacer 210 may be enlarged to more effectively protect the first contact 189 during an etching process that forms a recess for receiving the second contact 260.

Figure 3:
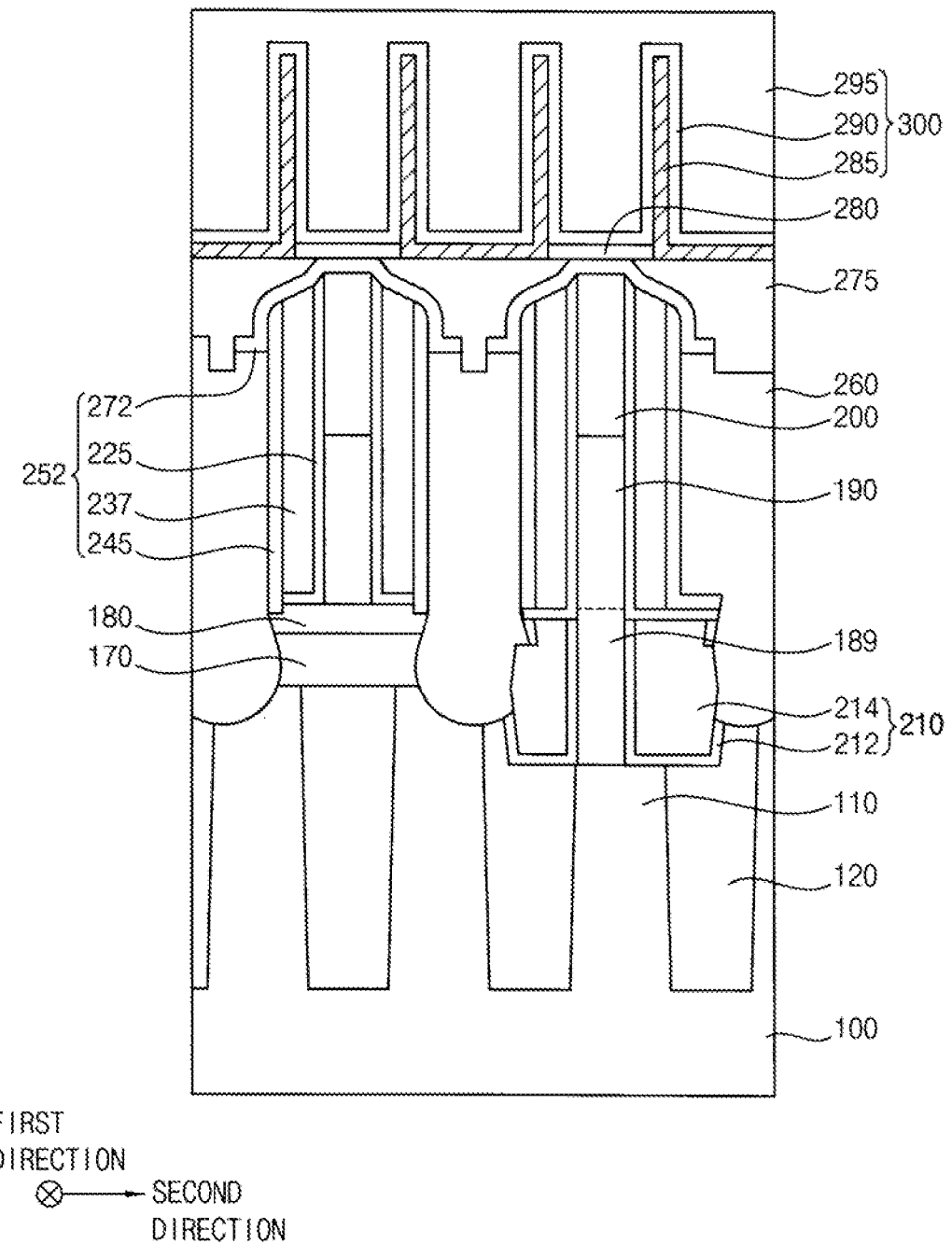
FIG. 3 is a cross-sectional view of a semiconductor device in accordance with some exemplary embodiments.

FIG. 3 is a cross-sectional view of a semiconductor device in accordance with some exemplary embodiments. The semiconductor device may be substantially the same as or similar to the semiconductor device described with reference to FIGS. 1 and 2. Thus, like reference numerals refer to like elements, and repetitive explanations thereof will be omitted.

A gate structure may be buried at the upper portion of the substrate 100. A bit line 190, spacers 210 and 252 that protect the bit line 190 and a hard mask 200 may be disposed on the substrate 100. Further, a capacitor 300 may be disposed above the bit line 190.

An isolation layer 120 that includes silicon oxide or silicon nitride may be disposed on the substrate 100, and an upper portion of the substrate 100 surrounded by the isolation layer 120 may be defined as the active pattern 110. Further, the active pattern 110 may be divided into a first region 112 and the second region 114.

The bit line 190, which extends in a second direction, may be disposed above the substrate 100, and the hard mask 200 may be disposed on the bit line 190. Further, a first contact 189 may be disposed between the bit line 190 and the active pattern 110.

The first spacer 210 and the second spacer 252 may be disposed on sidewalls of the bit line 190, the first contact 189 and the hard mask 200.

The first spacer 210 may surround the sidewall of the first contact 189. The first spacer 210 may be wider in a direction parallel to the top surface of the substrate 100. In exemplary embodiments, the first spacer 210 may have a first width W1 in the second direction. Further, the first spacer 210 may include a first insulation layer pattern 212 and a second insulation layer pattern 214.

The second spacer 252 may be disposed on sidewalls of the bit line 190 and the hard mask 200. In exemplary embodiments, the second spacer 252 may extend in the first direction along with the bit line 190. The second spacer 252 may protect and isolate the bit line 190. The second spacer 252 may have a second width W2 in the second direction which may be substantially the same as or less than the first width W1 of the first spacer 210.

The second spacer 252 may include a third insulation layer pattern 225, a fourth insulation layer pattern 245, a fifth insulation layer pattern 272 and a void 237 defined by the third to fifth insulation layer patterns 225, 245 and 272. In exemplary embodiments, the void 237 may be defined by a sidewall and a top surface of the third insulation layer pattern 225, a sidewall of the fourth insulation layer pattern 245 and a bottom surface of the fifth insulation layer pattern 272.

For example, the third insulation layer pattern 225, the fourth insulation layer pattern 245, the fifth insulation layer pattern 272 may include a nitride, such as silicon nitride. Further, the void 237 may include air, which has a relatively low dielectric constant, so that the second spacer 252 may reduce a parasitic capacitance between adjacent bit lines 190.

The capacitor 300 may be disposed above the hard mask 200. Further, the capacitor 300 may include a lower electrode 285, a dielectric layer 290 and an upper electrode 295. In exemplary embodiments, a plurality of capacitors 300 may be arranged in the first direction and the second direction, and each of the capacitors 300 may correspond to the second region 114 of the active pattern 100.

Accordingly, a semiconductor device may include the first contact 189, the first spacer 210 surrounding the first contact 189, the bit line 190 and the second spacer 252 surrounding the bit line 190. In this case, the enlarged first width W1 of the first spacer 210 may be substantially the same as or greater than the second width W2 of the second spacer 252. Therefore, the first spacer 210 may effectively protect the first contact 189 during an etching process that forms a recess for receiving the second contact 260. Further, the second spacer 252 may include the void 237 defined by the third to fifth insulation layer patterns 225, 245 and 272. Therefore, the second spacer 252 may reduce a parasitic capacitance between adjacent bit lines 190.

FIGS. 4 to 23 are plan views and cross-sectional views of stages of a method of manufacturing a semiconductor device in accordance with some exemplary embodiments. FIGS. 4, 6, 8A, 8B, 10, 12, 16, 18 and 22 are plan views of stages of the method of manufacturing the semiconductor device in accordance with some exemplary embodiments. FIGS. 5, 9, 11, 13, 14, 15, 17, 19, 20, 21 and 23 are cross-sectional views along lines I-I' of the plan views, and FIG. 7 is cross-sectional views along line II-II' of FIG. 6.

Figure 4:
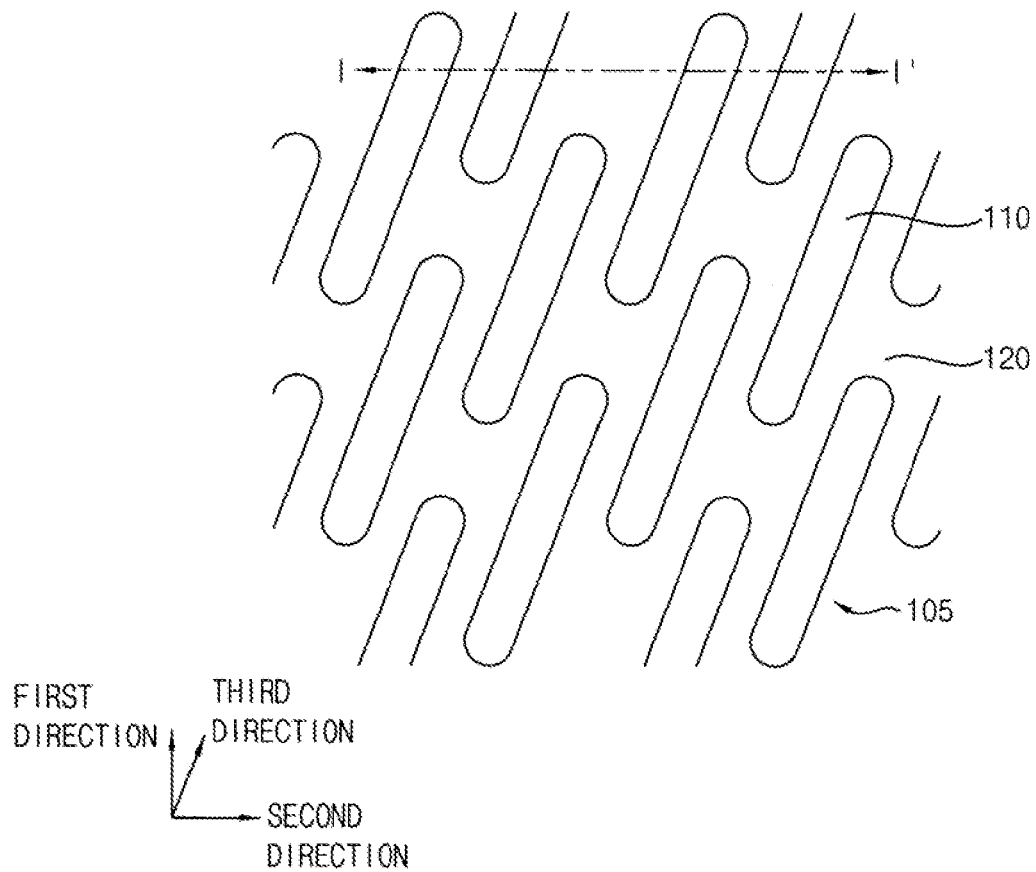
FIGS. 4 to 23 are plan views and cross-sectional views of stages of a method of manufacturing a semiconductor device in accordance with some exemplary embodiments.
Figure 5:
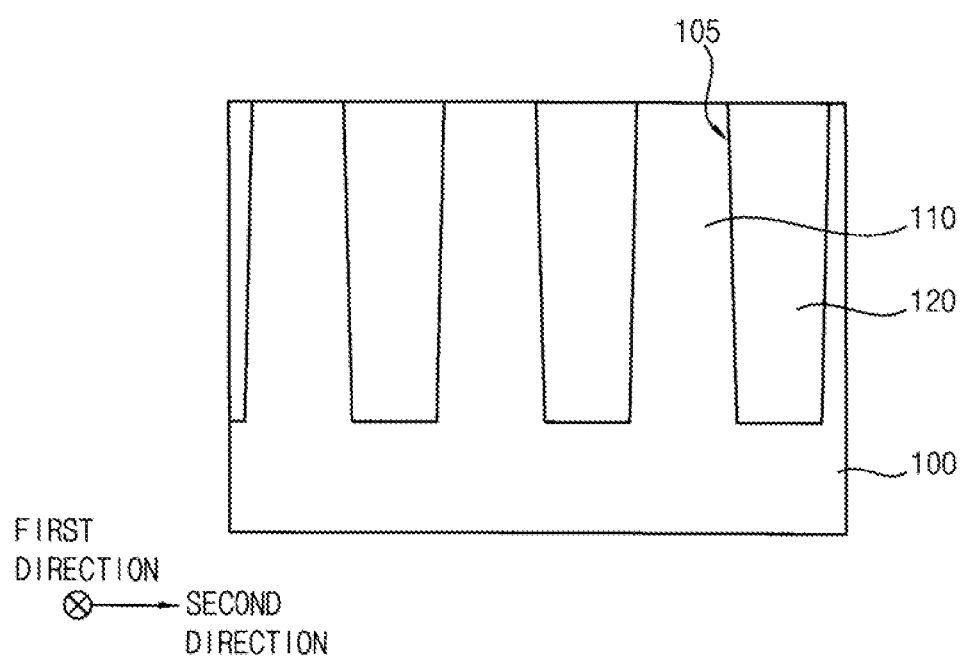

Referring to FIGS. 4 and 5, an isolation layer 120 may be formed on a substrate 100, which defines an active pattern 110.

The substrate 100 may include a semiconductor, such as silicon, germanium, silicon-germanium, a silicon-on-insulator (SOI), or a germanium-on-insulator (GOI).

The isolation layer 120 may be formed by a shallow trench isolation (STI) process using silicon oxide and/or silicon nitride. That is, an upper portion of the substrate 100 may be removed to form a first trench 105, and the isolation layer 120 may be formed to fill the first trench 105. Therefore, the substrate 100 may be divided into a field region where the isolation layer 120 may be disposed and an active region where no isolation layer 120 may be disposed, and an upper portion of the substrate 100 in the active region may be defined as the active pattern 110.

In exemplary embodiments, a plurality of active patterns 110 may be substantially parallel to a top surface of the substrate 100, spaced apart in a first direction and a second direction substantially perpendicular to the first direction. Each of the active patterns 110 may extend in a third direction obliquely oriented with respect to the first direction.

Further, impurities such as n-type impurities or p-type impurities may be doped into the substrate 100 before forming the isolation layer 120.

Figure 6:
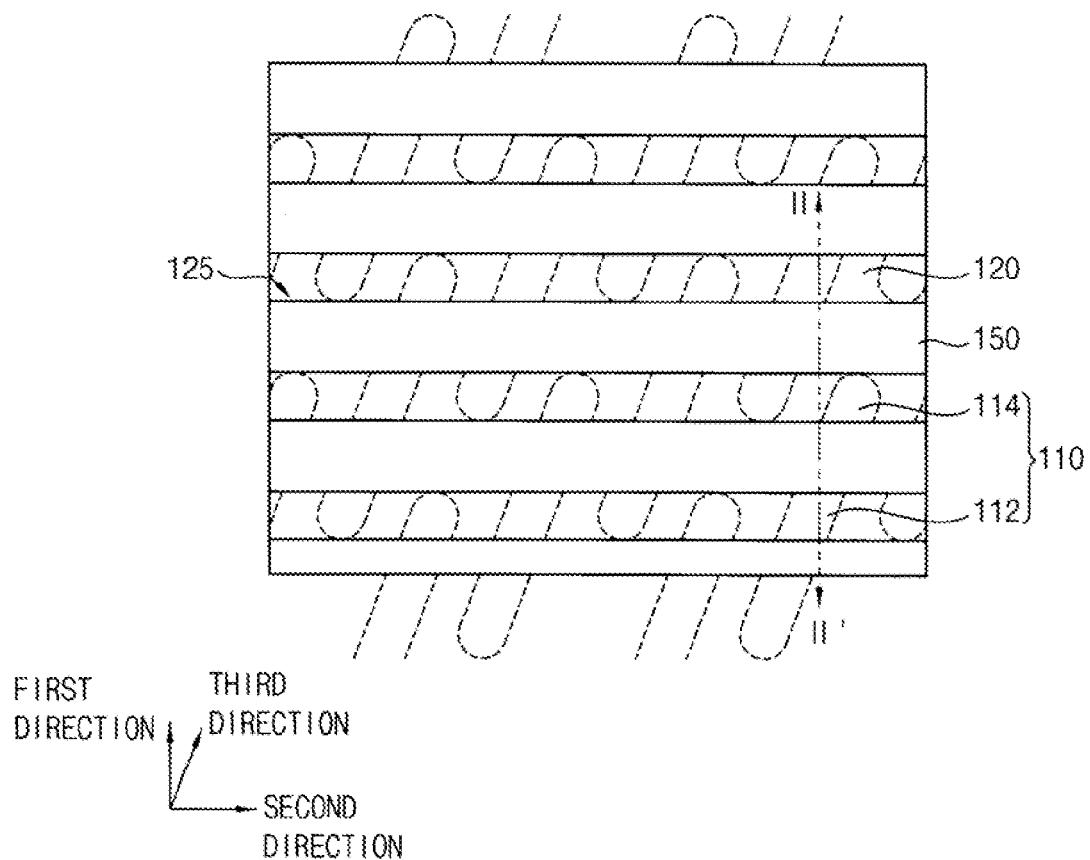

Referring to FIGS. 6 and 7, upper portions of the substrate 100 and the isolation layer 120 may be removed to form a second trench 125. Then, a gate insulation layer pattern 130, a gate electrode 140, and a gate mask 150 may be formed to fill the second trench 125.

The second trench 125 may extend in the second direction. In exemplary embodiments, a plurality of second trenches 125 may be spaced apart from each other in the first direction. For example, a pair of second trenches 125 may be disposed to overlap a single active pattern 110 as illustrated in FIG. 6. Therefore, the active pattern 110 may be divided into a first region 112 between the pair of second trenches 125 and second regions 114 at outer portions of the active pattern 110.

The gate insulation layer pattern 130 and the gate electrode 140 may be formed by filling the second trench 125 on the substrate 100 and the isolation layer 120 with a gate insulation layer and a gate electrode layer, and by planarizing upper portions of the gate insulation layer and the gate electrode layer by an etch back process or a CMP process. The gate electrode 140 may extend in the second direction, and may serve as a word line of the semiconductor device.

In exemplary embodiment, the gate insulation layer may be formed by thermally oxidizing a surface of the substrate 100 exposed by the second trench 125, or by performing a chemical vapor deposition (CVD) process or an atomic layer deposition (ALD) process using silicon oxide or a metal oxide. Further, the gate electrode layer may be formed using a metal or a metal nitride, such as tungsten (W), tantalum nitride (TaN), titanium nitride (TiN), and/or tungsten nitride (WN), by a physical vapor deposition process, an ALD process, or a sputtering process.

Then, the gate mask 150 may be formed on the gate electrode 140 to fill an upper portion of the second trench 125. For example, the gate mask layer may be formed using silicon nitride or silicon oxy-nitride.

Therefore, a gate structure 160 may be formed that includes the gate insulation layer pattern 130, the gate electrode 140, and the gate mask 150. For example, the gate electrode 140 of the gate structure may be buried at the upper portion of the substrate 100, so that the gate structure may constitute a buried channel array transistor.

Figure 8A:
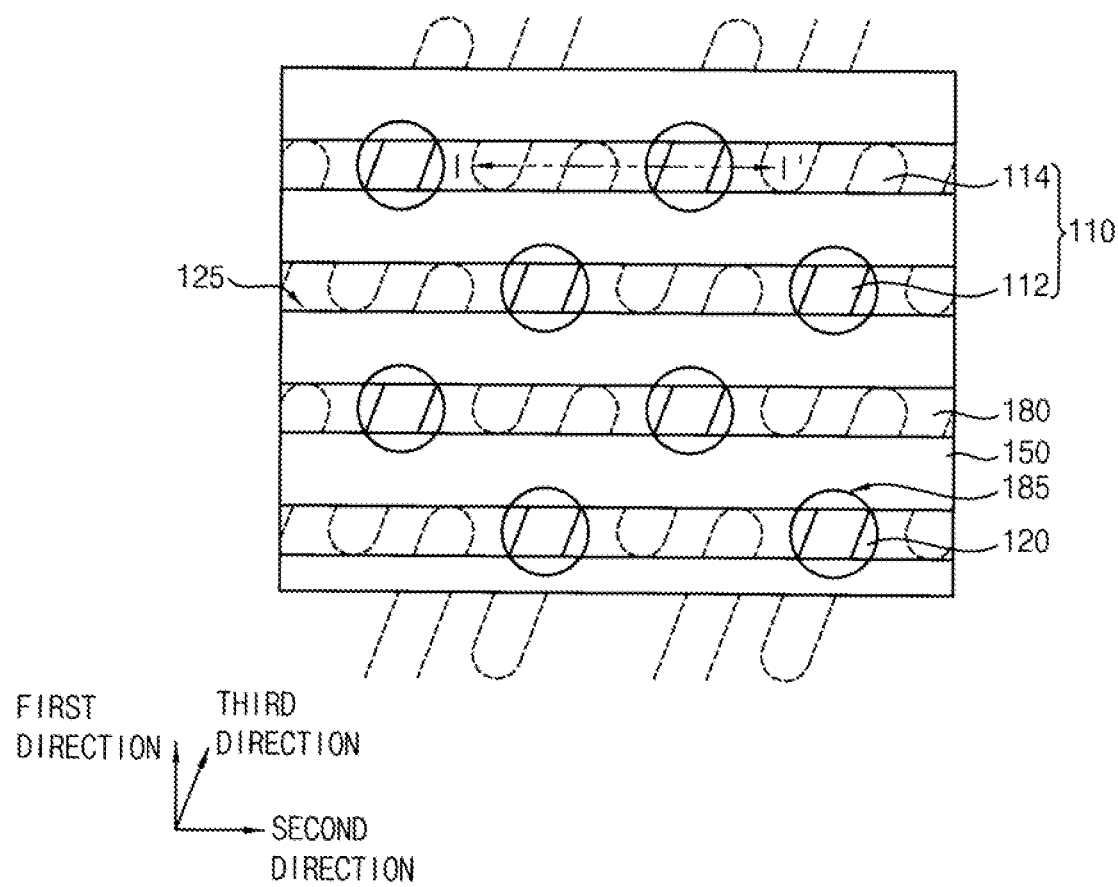
Figure 9:
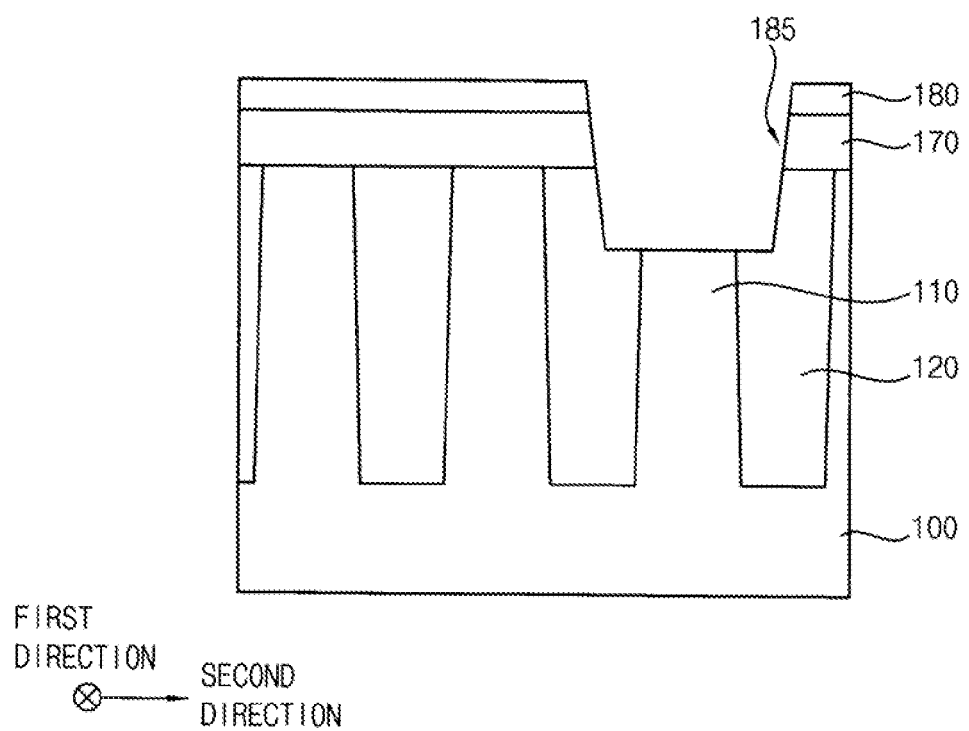

Referring to FIGS. 8A and 9, a first insulating interlayer 170 and a second insulating interlayer 180 may be formed on the substrate 100, the isolation layer 120 and the gate structure 160, and then a first recess 185 that exposes the first region 112 of the active pattern 110 may be formed.

For example, the first insulating interlayer 170 may include an oxide, such as silicon oxide, and the second insulating interlayer 180 may include a nitride, such as silicon nitride. Therefore, the first insulating interlayer 170 and the second insulating interlayer 180 may have an etch selectivity with respect to each other.

Then, portions of the first insulating interlayer 170, the second insulating interlayer 180, the active pattern 110 and the isolation layer 120 may be removed to form the first recess 185. That is, the first recess 185 may be defined by a top surface of the active pattern 100, a top surface and a sidewall of the isolation layer 120, a sidewall of the first insulating interlayer 170 and a sidewall of the second insulating interlayer 180. Therefore, a bottom surface of the first recess 185 may be substantially lower than a top surface of the active pattern 110.

The first recess 185 may expose the first region 112 of the active pattern 110. In exemplary embodiment, a mask may be formed on the second insulating interlayer 180, and then an etching process may be performed using the mask as an etching mask to expose the first region 112 of the active pattern 110, to form the first recess 185.

Figure 8B:
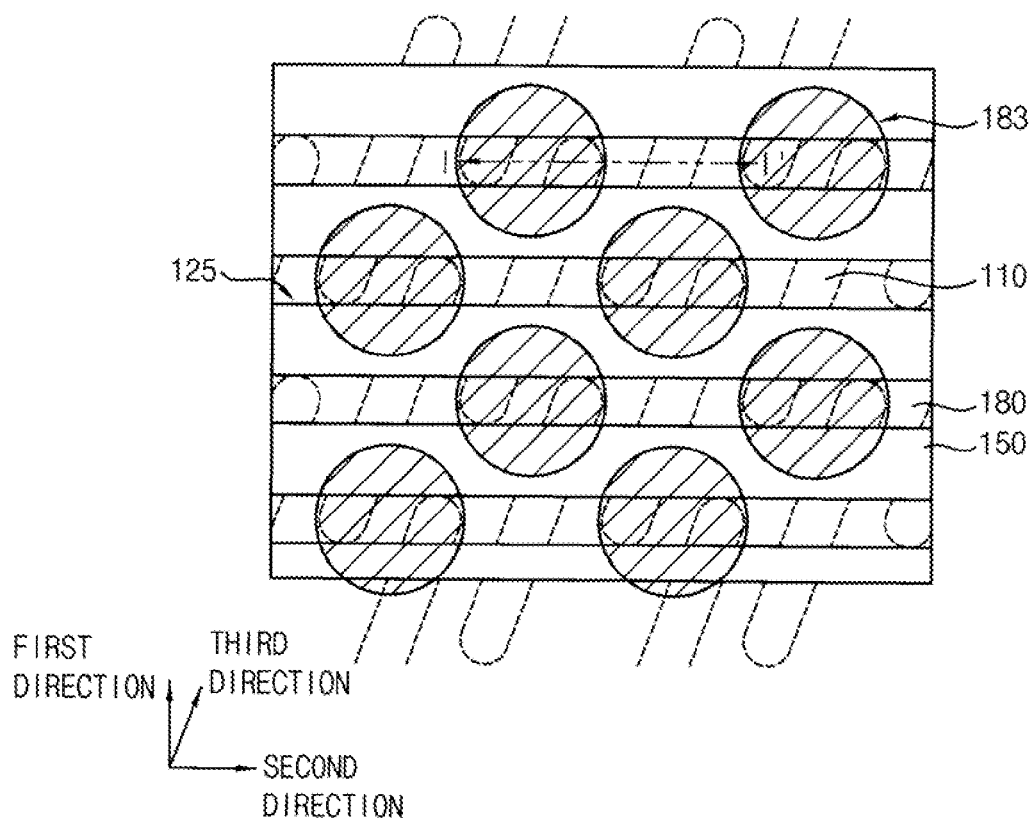

In other exemplary embodiments, a mask 183 covering the second region 114 of the active pattern 110 may be formed on the second insulating interlayer 180 as illustrated in FIG. 8B, and then an etching process may be performed using the mask 183 as an etching mask, to form the first recess 185.

Figure 10:
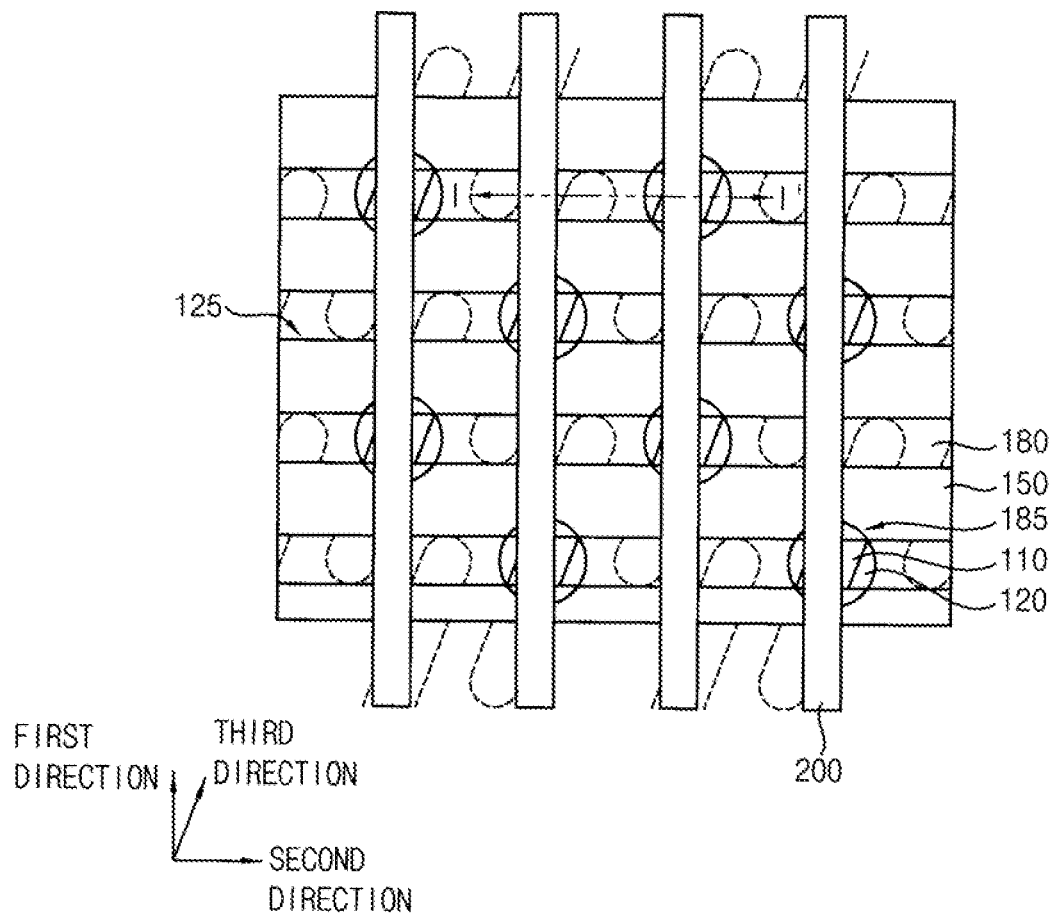
Figure 11:
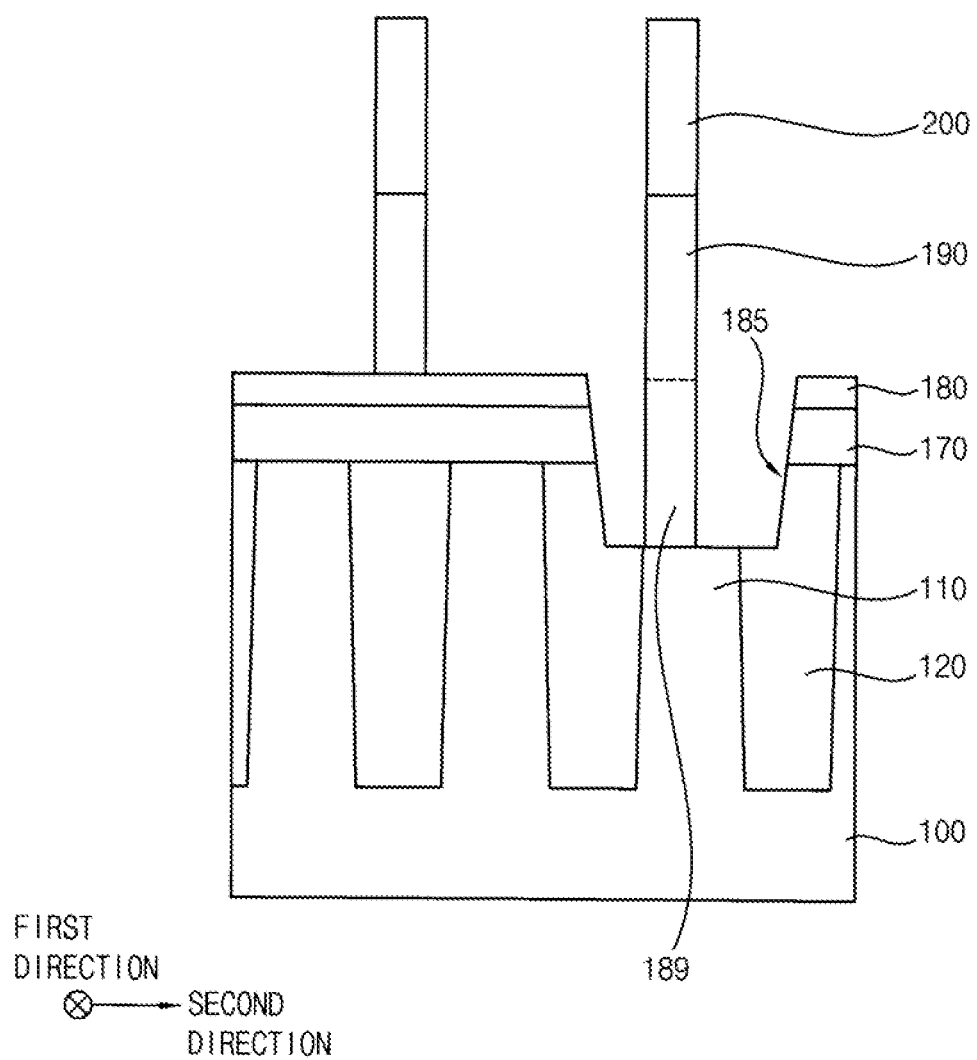

Referring to FIGS. 10 and 11, a first contact 189, a bit line 190 and a hard mask 200 may be formed on the substrate 100 in the first recess 185 and on the second insulating interlayer 180.

In particular, a first conductive layer, a second conductive layer and a hard mask layer may be sequentially formed on the substrate 100 and the second insulating interlayer 180 to fill the first recess 185, and then the first conductive layer, the second conductive layer and the hard mask layer may be partially removed to form the first contact 189, the bit line 190 and the hard mask 200.

The first contact 189 and the bit line 190 may be formed using a metal, a metal nitride or doped polysilicon. For example, the first contact 189 may include doped polysilicon, and the bit line 190 may have a multi layered structure that includes doped polysilicon and a metal, such as tungsten. Further, the hard mask 200 may include a nitride, such as silicon nitride.

The bit line 190 and the hard mask 200 may extend in the first direction. In exemplary embodiments, a plurality of bit lines 190 and a plurality of hard masks 200 may be spaced apart in the second direction. Further, the first contact 189 may be disposed in the first recess 185, to directly contact the first region 112 of the active pattern 110. Therefore, the first contact 189 may electrically connect the bit line 190 with the first region 112 of the active pattern 110. That is, the first contact 189 may serve as a bit line contact.

Figure 12:
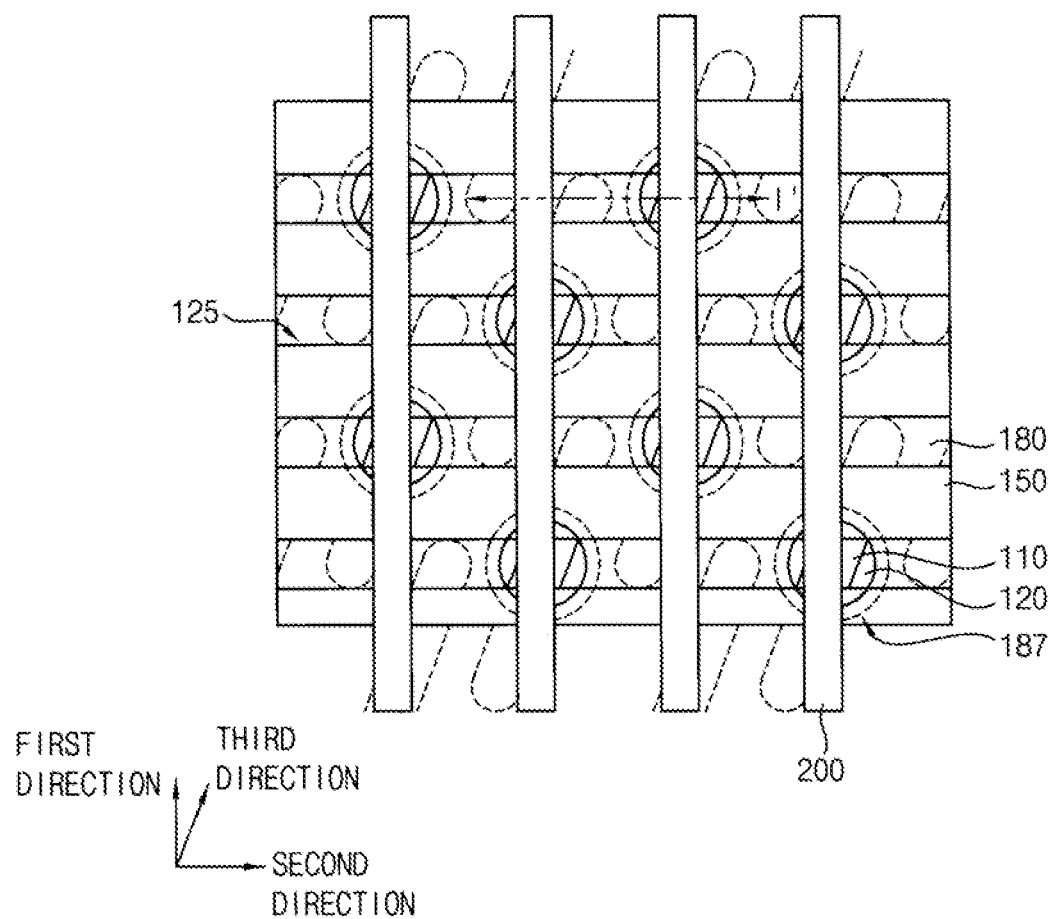
Figure 13:
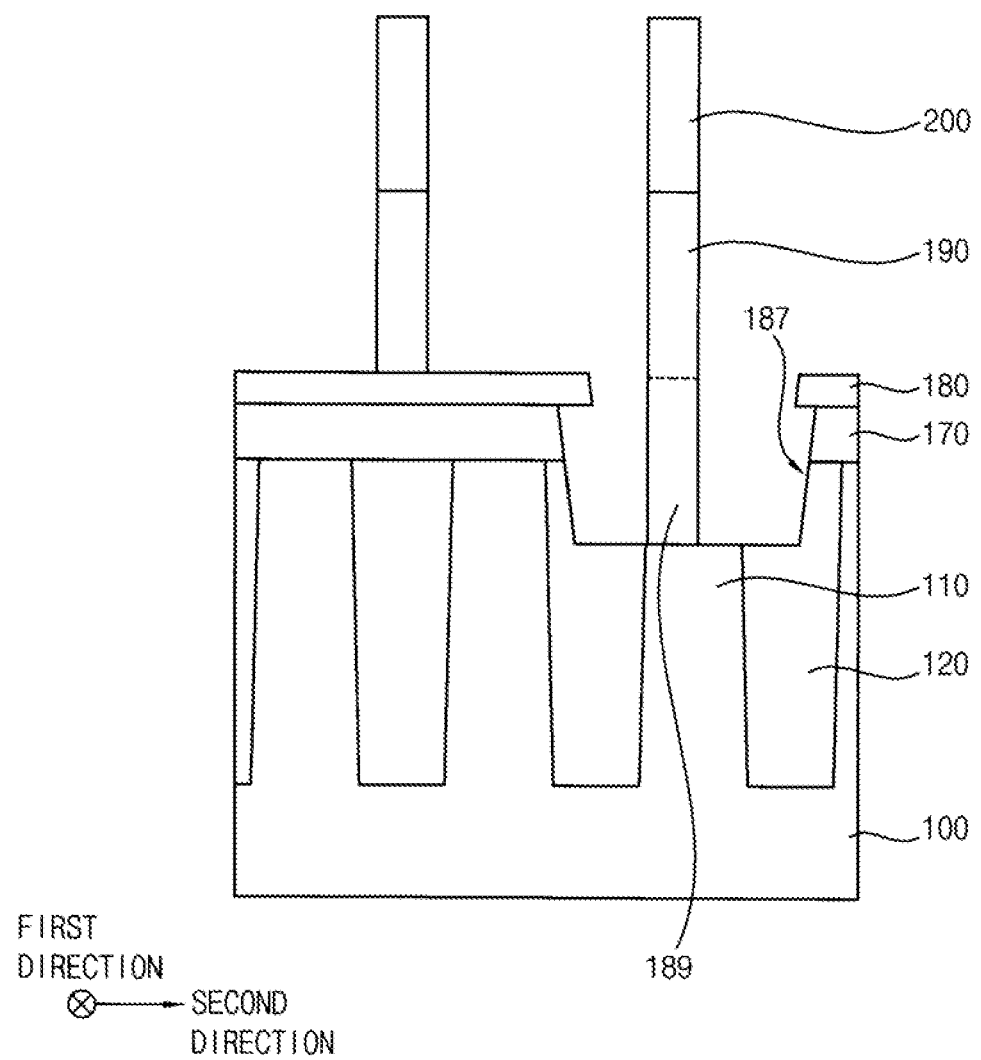

Referring to FIGS. 12 and 13, portions of the active pattern 110, the isolation layer 120 and the first insulating interlayer 170 exposed by the first recess 185 may be removed to form an enlarged first recess 187.

In exemplary embodiments, a wet etching process may be performed to expand the first recess 185. For example, the wet etching process may use an etching solution and may be an isotropic etching process. In this case, the etching solution may have a relatively low etch rate with respect to the second insulating interlayer 180, to remove portions of the active pattern 110, the isolation layer 120 and the first insulating interlayer 170 not covered by the second insulating interlayer 180.

Therefore, the enlarged first recess 187 may be defined by the top surface of active pattern 110, the top surface and the sidewall of the isolation layer 120, the sidewall of the first insulating interlayer 170 and the sidewall and a bottom surface of the second insulating interlayer 180. In this case, a portion of the enlarged first recess 187 defined by the first insulating interlayer 170 may be substantially wider than a portion of the enlarged first recess 187 defined by the second insulating interlayer 180.

Figure 14:
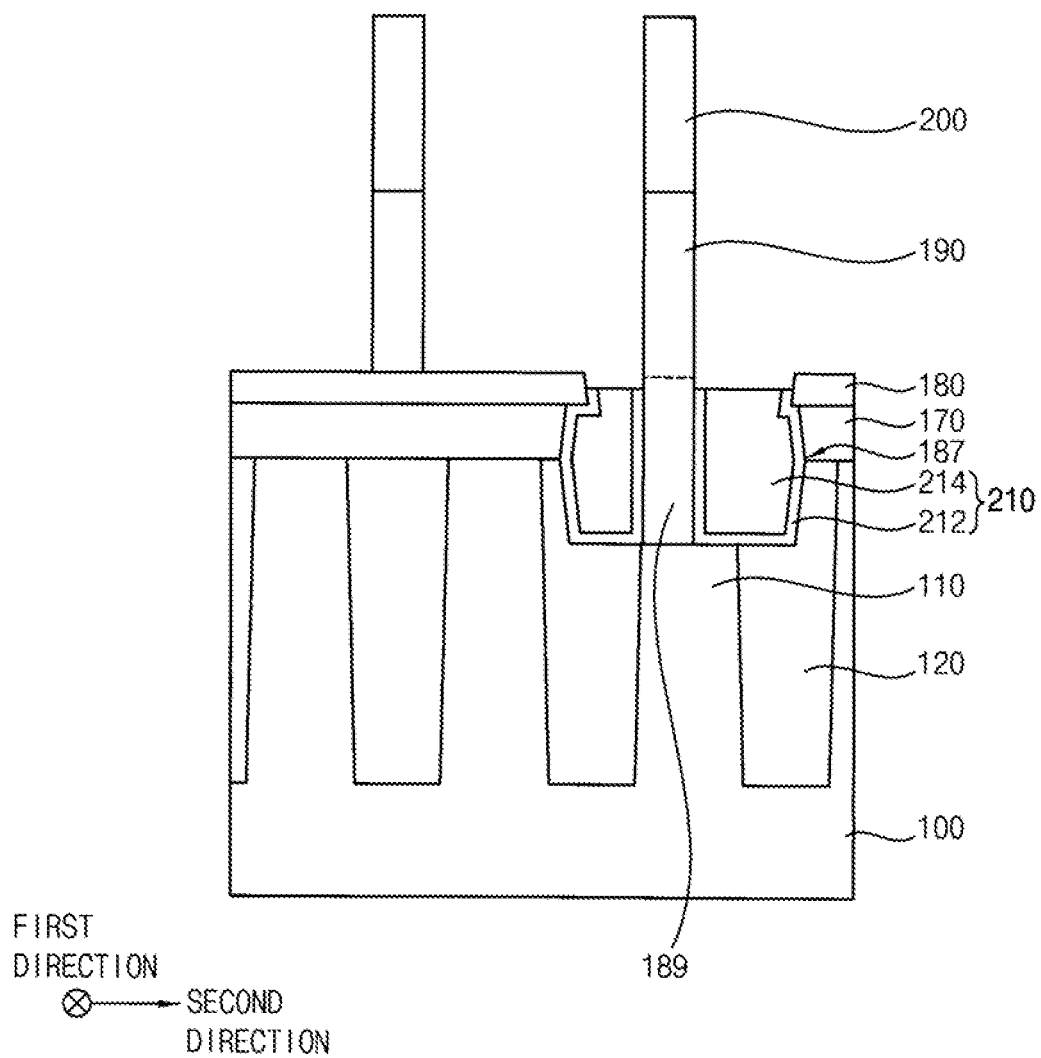

Referring to FIG. 14, a first spacer 210 may be formed to fill the enlarged first recess 187.

In particular, a first insulation layer and a second insulation layer may be sequentially formed on an inner wall of the enlarged first recess 187, a sidewall of the bit line 190, a top surface and the sidewall of the hard mask 200 and the top surface of the second insulating interlayer 180, and then upper portions of the first and second insulation layers may be removed to form the first insulation layer pattern 212 and the second insulation layer pattern 214 that fill the enlarged first recess 187.

Therefore, the first spacer 210 may be formed that includes the first insulation layer pattern 212 and the second insulation layer pattern 214. The first spacer 210 may surround the sidewall of the first contact 189 and fill the enlarged first recess 187. Therefore, the first spacer 210 may have a shape that corresponds to the enlarged first recess 187. That is, the first spacer 210 may be wider in a direction parallel to the top surface of the substrate 100. In exemplary embodiments, a first width W1 of the first spacer 210 may be substantially greater than or equal to a second width W2 of the second spacer 250 (See FIG. 17). Further, a top surface of the first spacer 210 may be lower than the top surface of the second insulating interlayer 180.

For example, the first insulation layer pattern 212 may include an oxide, such as silicon oxide, and the second insulation layer pattern 214 may include a nitride, such as silicon nitride.

Figure 15:
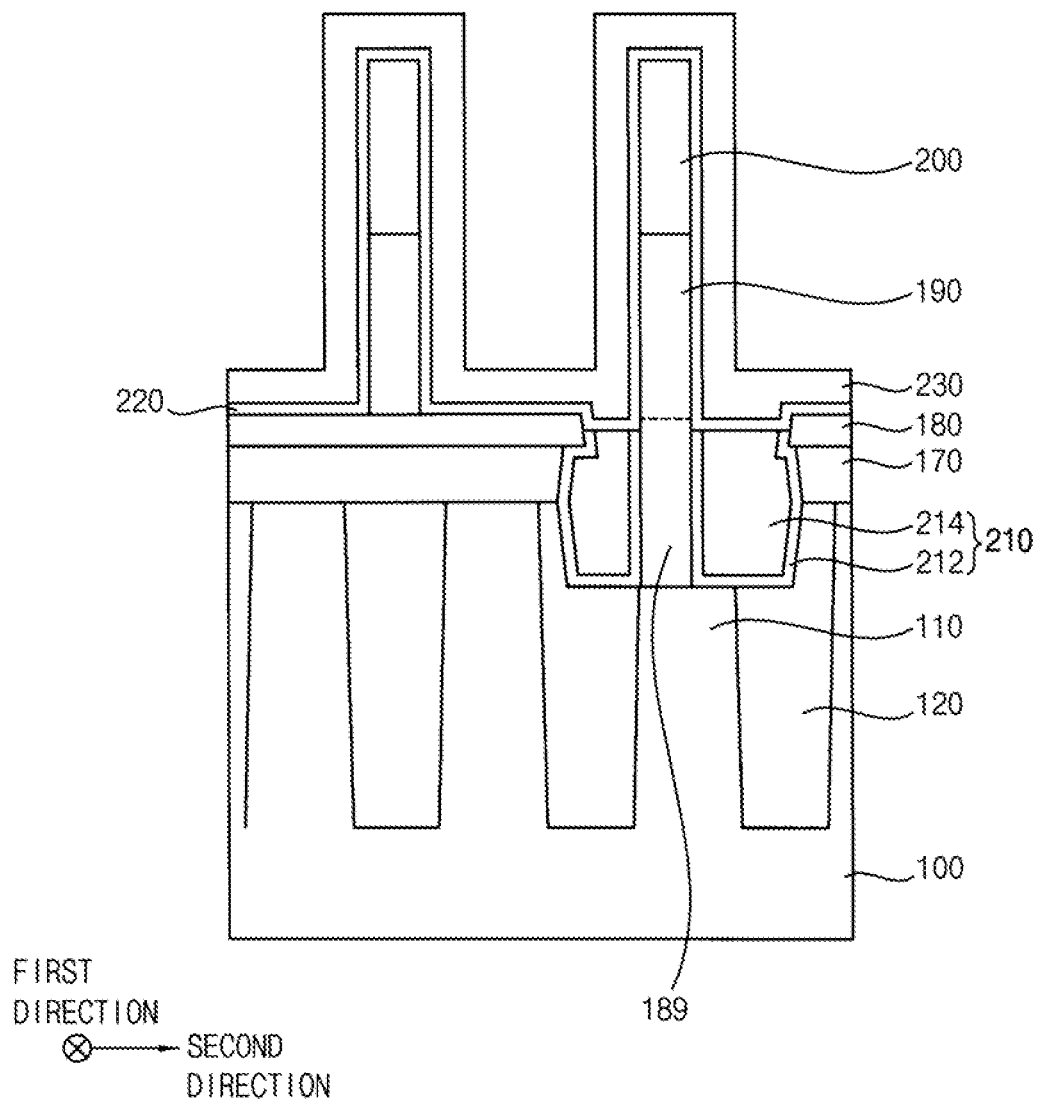

Referring to FIG. 15, a third insulation layer 220 and a fourth insulation layer 230 may be formed on a top surface of the second insulating interlayer 180, the sidewall of the bit line 190, the top surface and the sidewall of the hard mask 200 and a top surface of the first spacer 210.

In exemplary embodiments, the third insulation layer 220 may include a nitride, such as silicon nitride, and the fourth insulation layer 230 may include an oxide, such as silicon oxide.

Figure 16:
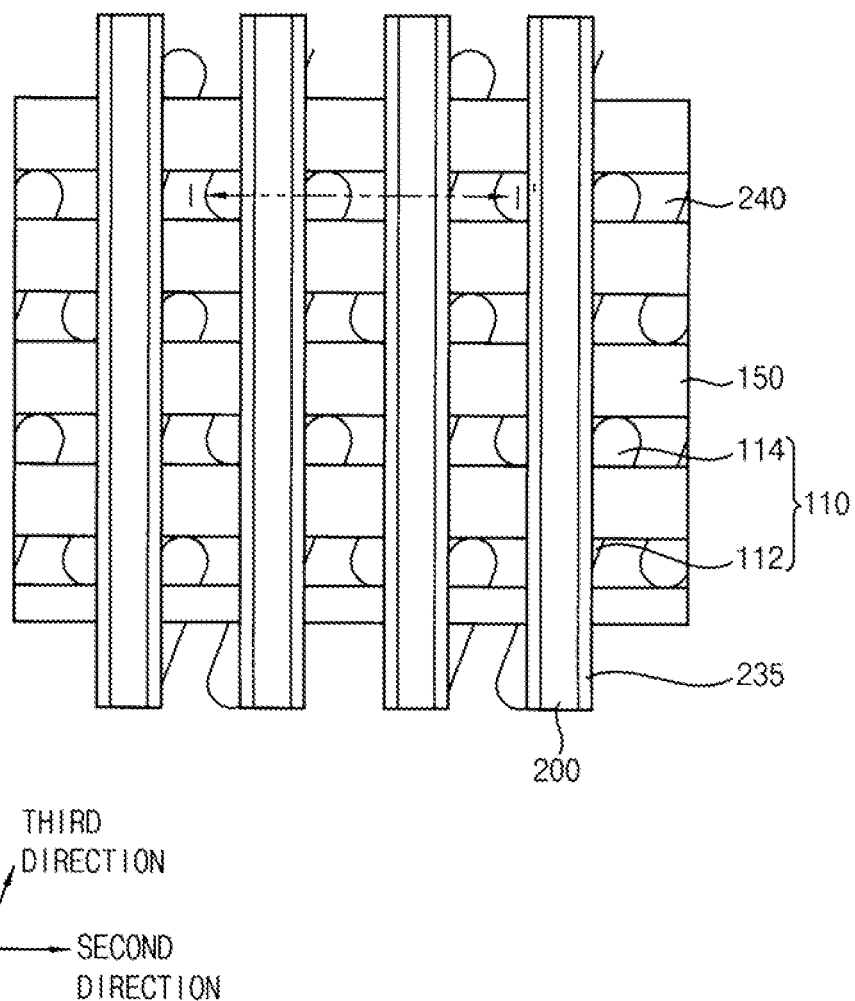
Figure 17:
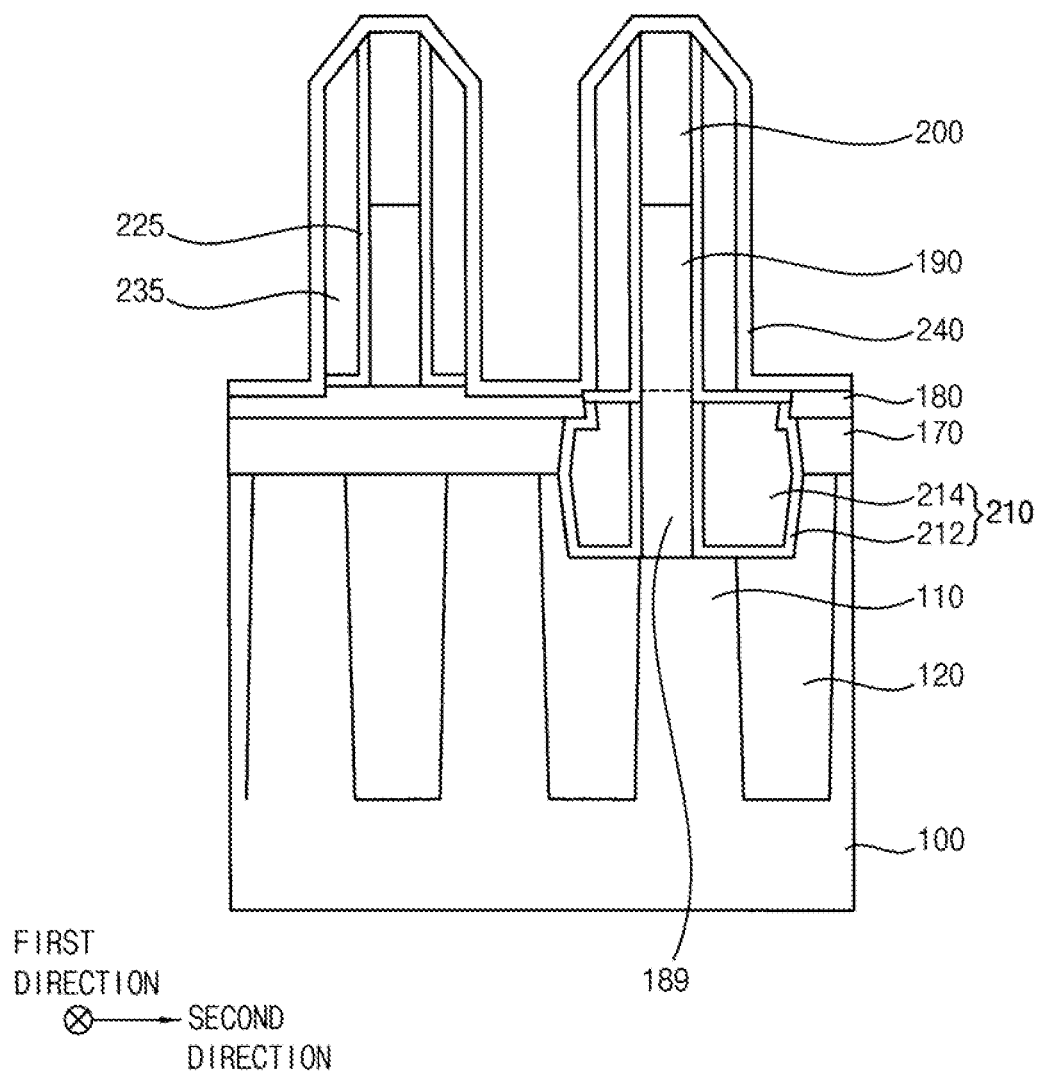

Referring to FIGS. 16 and 17, the third insulation layer 220 and the fourth insulation layer 230 may be partially removed to form the third insulation layer pattern 225 and the fourth insulation layer pattern 235. Then, a fifth insulation layer 240 may be formed to cover the third insulation layer pattern 225 and the fourth insulation layer pattern 235.

In particular, an anisotropic etching process may be performed to partially remove the third insulation layer 220 and the fourth insulation layer 230. Therefore, the third insulation layer pattern 225 may be disposed on the sidewall of the bit line 190, the sidewall of the hard mask 200 and the top surface of the first spacer 210, and the fourth insulation layer pattern 235 may be disposed on the third insulation layer pattern 225. The third insulation layer pattern 225 and the fourth insulation layer pattern 235 may extend in the first direction. In exemplary embodiments, a plurality of third insulation layer patterns 225 and a plurality of fourth insulation layer pattern 235 may be spaced apart in the second direction.

Further, the fifth insulation layer 240 may be formed to cover the third insulation layer pattern 225, the fourth insulation layer pattern 235 and the hard mask 200. In exemplary embodiments, the fifth insulation layer 240 may include a nitride, such as silicon nitride.

Figure 18:
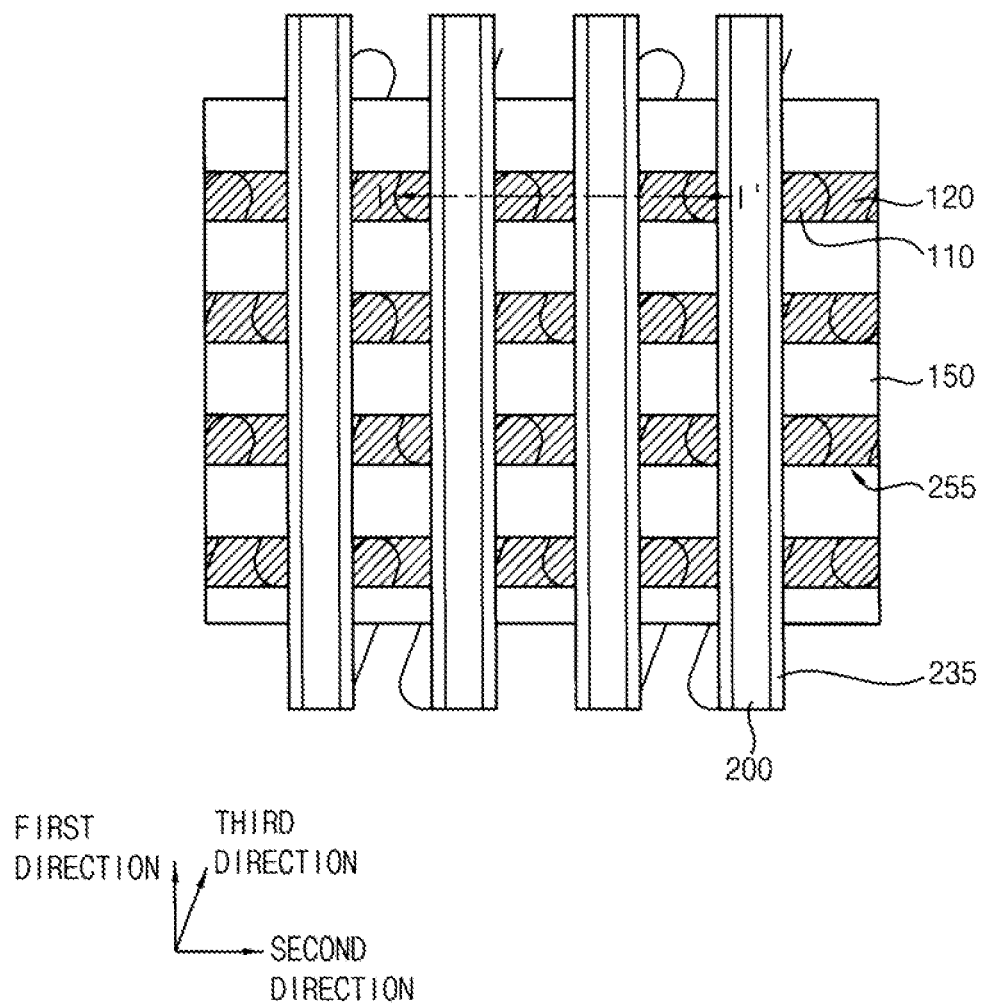
Figure 19:
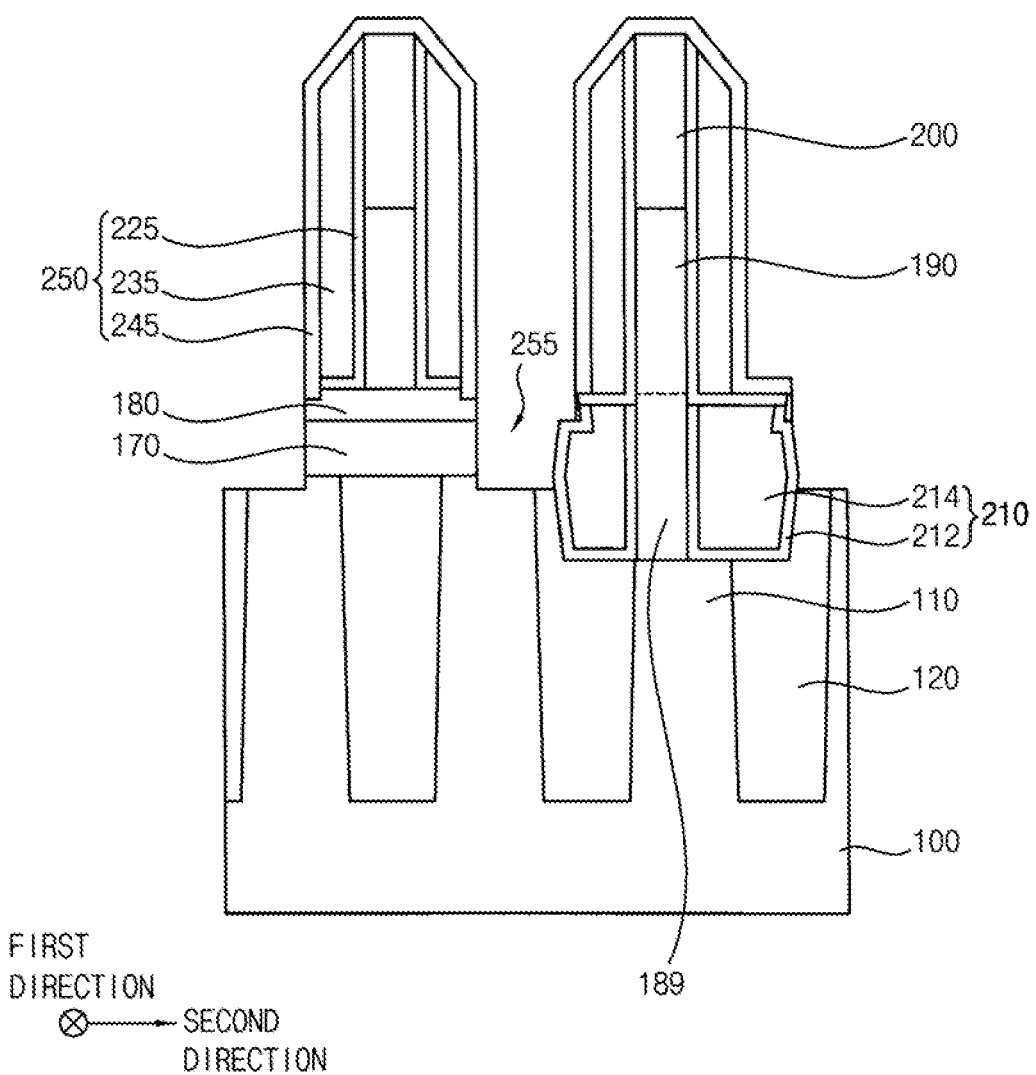

Referring to FIGS. 18 and 19, portions of the fifth insulation layer 240, the second insulating interlayer 180, the first insulating interlayer 170, the isolation layer 120 and the active pattern 110 between the second spacers may be removed to form a second recess 255.

In exemplary embodiments, an etching process that uses the fourth insulation layer pattern 235, the hard mask 220 and the gate mask 150 as an etching mask may be performed to remove portions of the fifth insulation layer 240, the second insulating interlayer 180, the first insulating interlayer 170, the isolation layer 120 and the active pattern 110. The etching process may be an anisotropic etching process, and the second recess 255 may partially expose the active pattern 110 and the isolation layer 120.

In other exemplary embodiments, before performing the etching process, an insulation layer pattern that overlaps the gate mask 150 may be formed on the fifth insulation layer 240, and the insulation layer pattern may be used as an etching mask.

Therefore, the second recess 255 may be defined by a top surface of the second region 114 of the active pattern 110, the top surface of the isolation layer 120, the sidewall of the first insulating interlayer 170, the sidewall of the second insulating interlayer 180 and the sidewall of the first insulation layer pattern 212 (or the second insulation layer pattern 214).

Further, portions of fifth insulation layer 240 may be removed during the etching process, to form a fifth insulation layer pattern 245. Therefore, a second spacer 250 may be formed that includes the third insulation layer pattern 225, the fourth insulation layer pattern 235 and the fifth insulation layer pattern 245. The second spacer 250 may surround the sidewalls of the bit line 190 and the hard mask 200. The second spacer 250 may have a second width in the second direction which may be substantially equal to or less than the first width of the first spacer 210.

Figure 20:
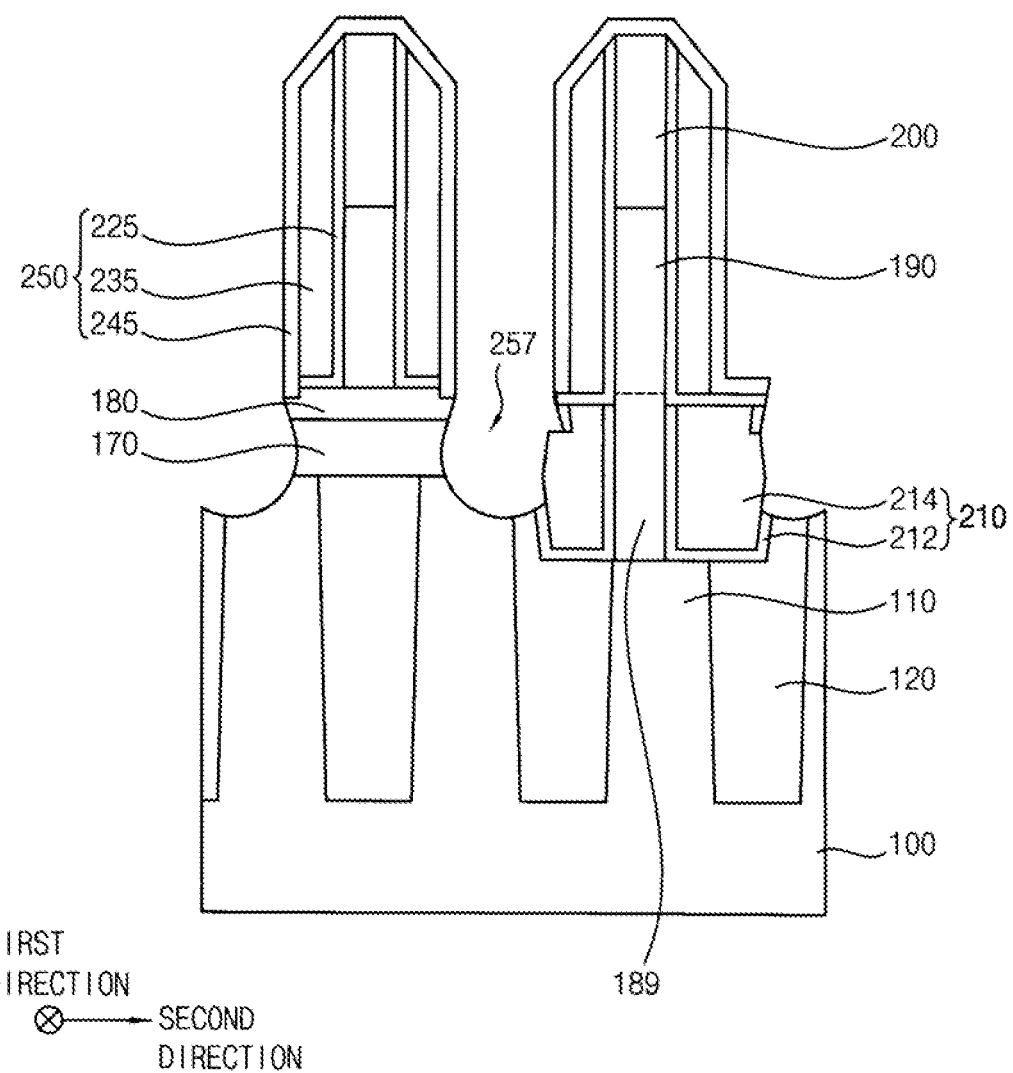

Referring to FIG. 20, portions of the second insulating interlayer 180, the first insulating interlayer 170, the isolation layer 120 and the active pattern 110 may be removed to form an enlarged second recess 257.

In particular, a wet etching process that uses an etching solution may be performed to expand the second recess 255. In this case, the etching solution may have a relatively low etch rate with respect to the second insulation layer pattern 214, and a relatively high etch rate with respect to the first insulation layer pattern 212.

Therefore, the enlarged second recess 257 may be defined by the top surface of the active pattern 110, the top surface of the isolation layer 120, the sidewall of the first insulating interlayer 170, the sidewall of the second insulating interlayer 180 and the sidewall of the second insulation layer pattern 214. As the second recess 255 may be enlarged, an area of the active pattern 110 exposed by the enlarged second recess 257 may increase.

Further, the first width of the first spacer 210 may be greater than the second width of the second spacer 250, so that the first contact 189 may not be exposed by the enlarged second recess 257, even though the first spacer 210 is partially removed or damaged during the etching process. Therefore, the first spacer 210 may effectively protect the first contact 189, and the semiconductor device may have an improved reliability.

Figure 21:
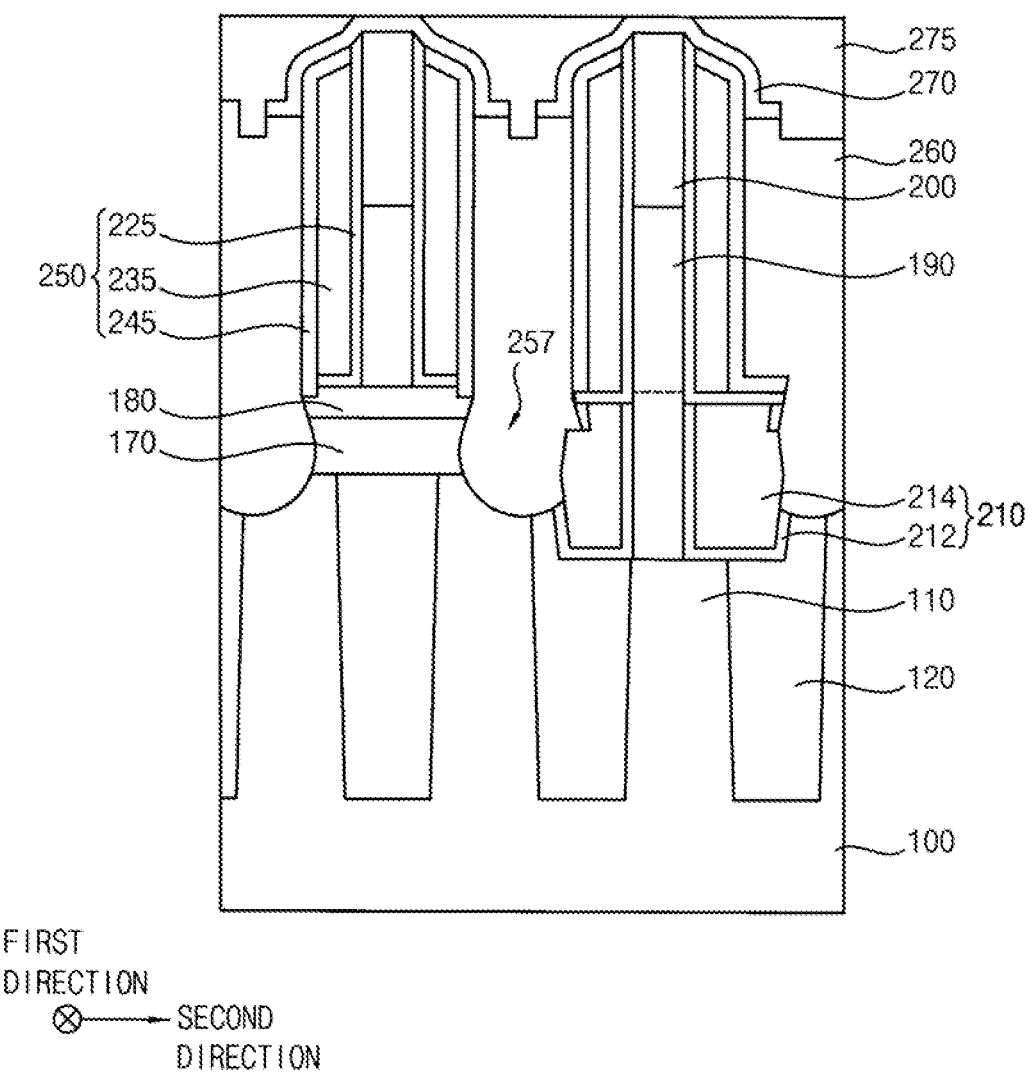

Referring to FIG. 21, a second contact 260, a sixth insulation layer pattern 270 and a third contact 275 may be formed.

A third conductive layer may be formed on the hard mask 200 and the fifth insulation layer pattern 245 to fill the enlarged second recess 257, and then an upper portion of the third conductive layer may be removed to form the second contact 260.

Therefore, the second contact 260 may directly contact the top surface of the second region 114 of the active pattern 110. A direct contact area between the second contact 260 and the active pattern 110 may increase, which may decrease an electrical resistance between the second contact 260 and the active pattern 110.

Then, a sixth insulation layer may be formed on the hard mask 200, the fifth insulation layer pattern 245 and the second contact 260, and then portions of the sixth insulation layer may be removed to form the sixth insulation layer pattern 270.

In addition, the third contact 275 may be disposed on the sixth insulation layer pattern 270, and may be electrically connected to the second contact 260. That is, the third contact 275 may be electrically connected to the second region 114 of the active pattern 110 by the second contact 260. That is, the second contact 260 and the third contact 275 may serve as a capacitor contact.

Figure 22:
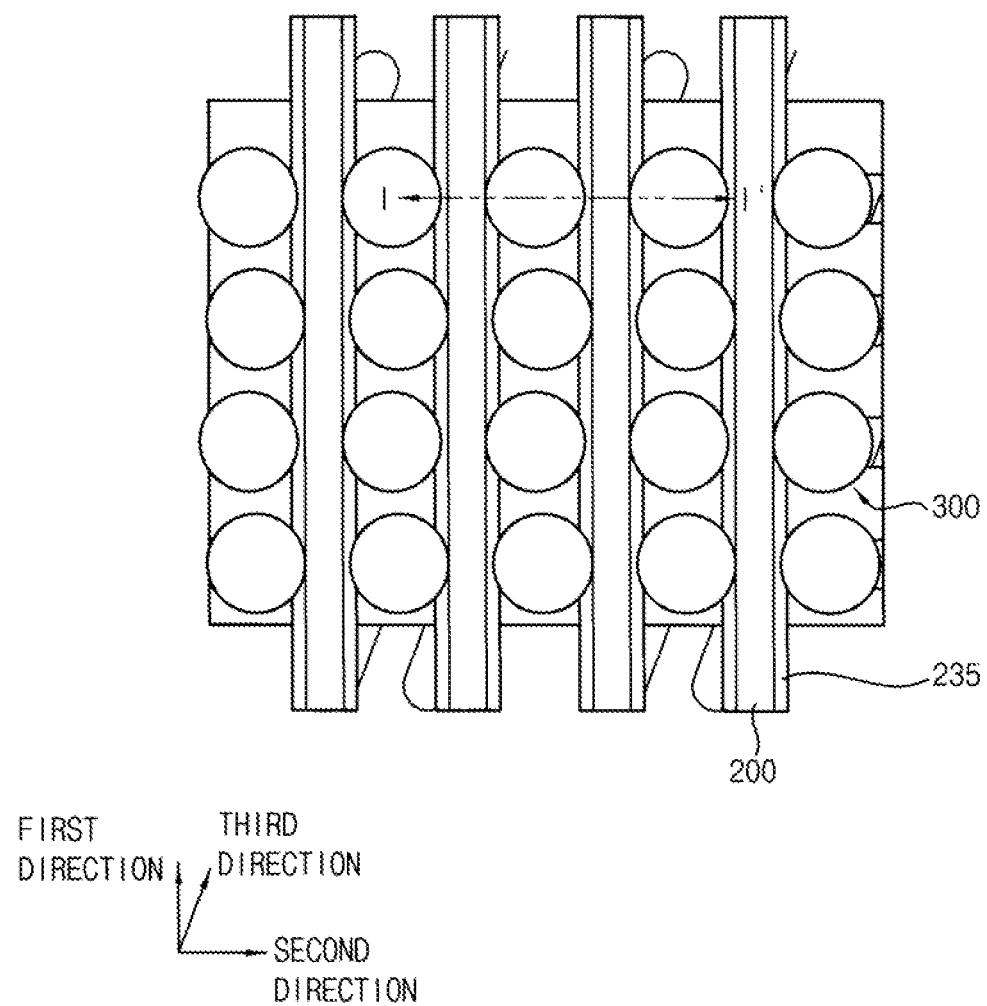
Figure 23:
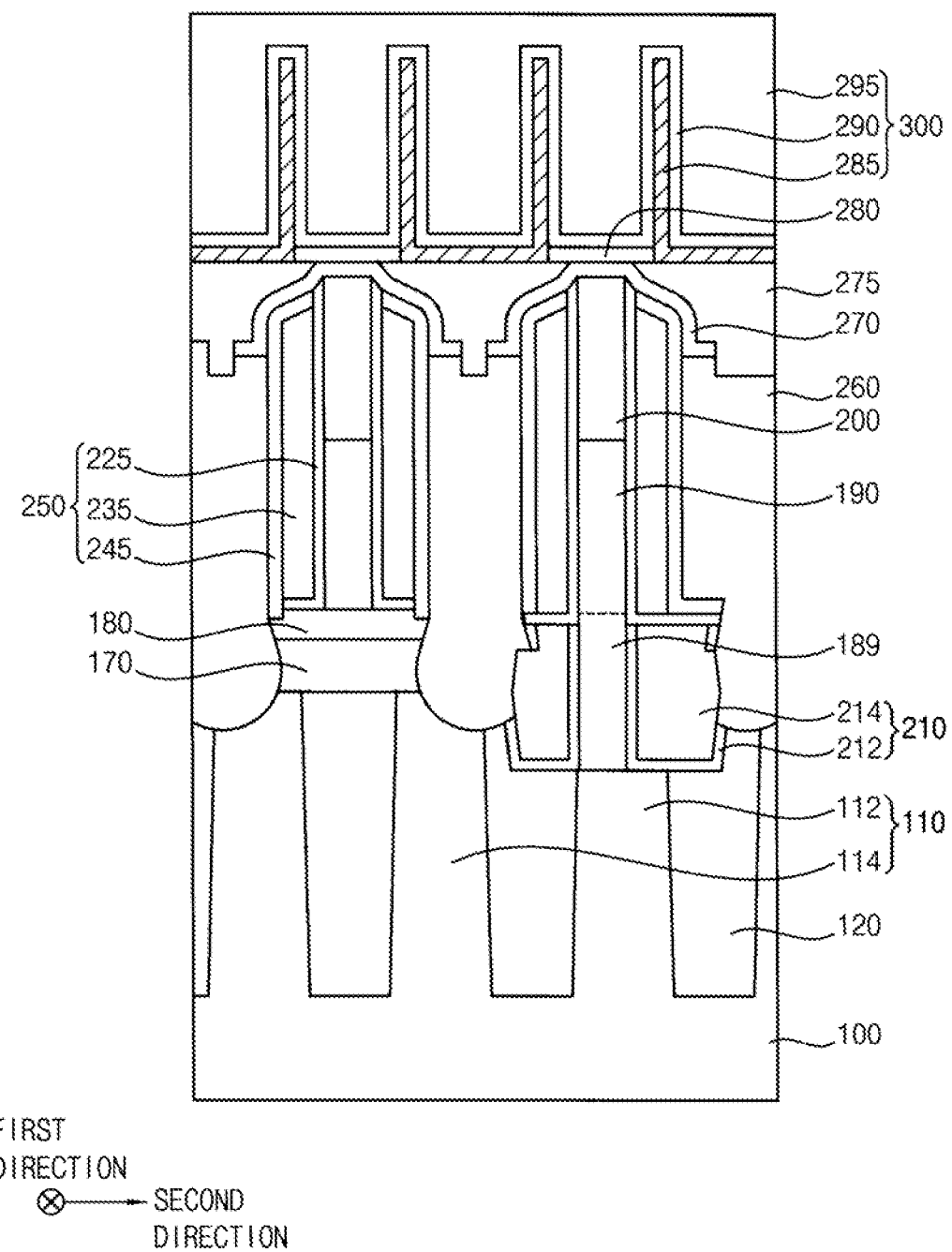

Referring to FIGS. 22 and 23, a capacitor 300 may be formed to be electrically connected to the third contact 275.

The capacitor 300 may include a lower electrode 285, a dielectric layer 290 and an upper electrode 295.

To forming the lower electrode 285, an etch stop layer 280 and a third insulating interlayer may be formed on the third contact 275, and portions of the etch stop layer 280 and the third insulating interlayer may be removed to form an opening exposing the third contact 275. A lower electrode layer may be formed on an inner wall of the opening, and an upper portion of the lower electrode layer may be planarized, thereby forming the lower electrode 285. Then, the third insulating interlayer may be removed.

The dielectric layer 290 may be formed using a high dielectric material that has a dielectric constant substantially greater than that of silicon oxide or silicon nitride. For example, the high dielectric material may include at least one of tantalum oxide, hafnium oxide, aluminum oxide, zirconium oxide, etc. The high dielectric material may be used alone, or as a mixture thereof. The dielectric layer 290 may be formed by a CVD process, a PVD process, an ALD process, etc.

Then, the upper electrode 295 may be formed using a metal, a metal nitride or doped polysilicon by a CVD process, a PVD process, an ALD process, etc. The upper electrode 295 may be a cylinder type or a thin film type. Therefore, the capacitor 300 may be formed that includes the lower electrode 285, the dielectric layer 290 and the upper electrode 295.

By performing the above processes, a semiconductor device may be completed.

FIGS. 24 to 29 are plan views and cross-sectional views of stages of a method of manufacturing a semiconductor device in accordance with other exemplary embodiments. Some aspects of the methods illustrated in FIGS. 24 to 29 are substantially the same as or similar to those illustrated with reference to FIGS. 4 to 23. Thus, like reference numerals may refer to like elements, and repetitive explanations thereof will be omitted.

Figure 24:
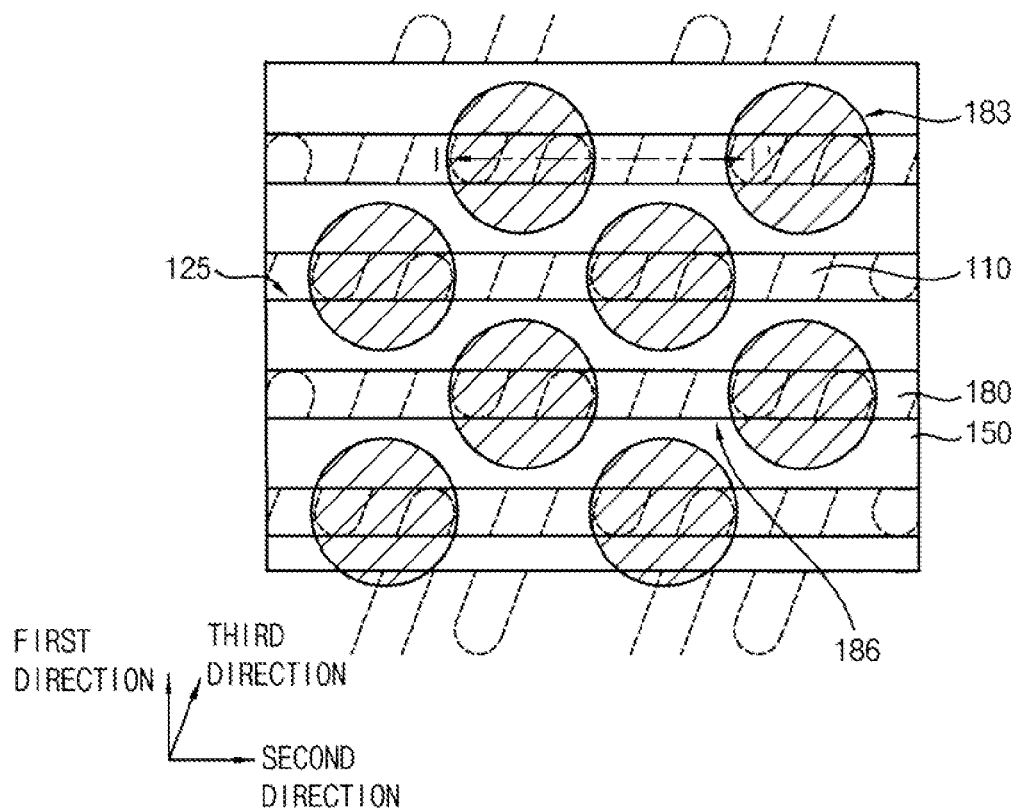
FIGS. 24 to 29 are plan views and cross-sectional views of stages of a method of manufacturing a semiconductor device in accordance with some exemplary embodiments.
Figure 25:
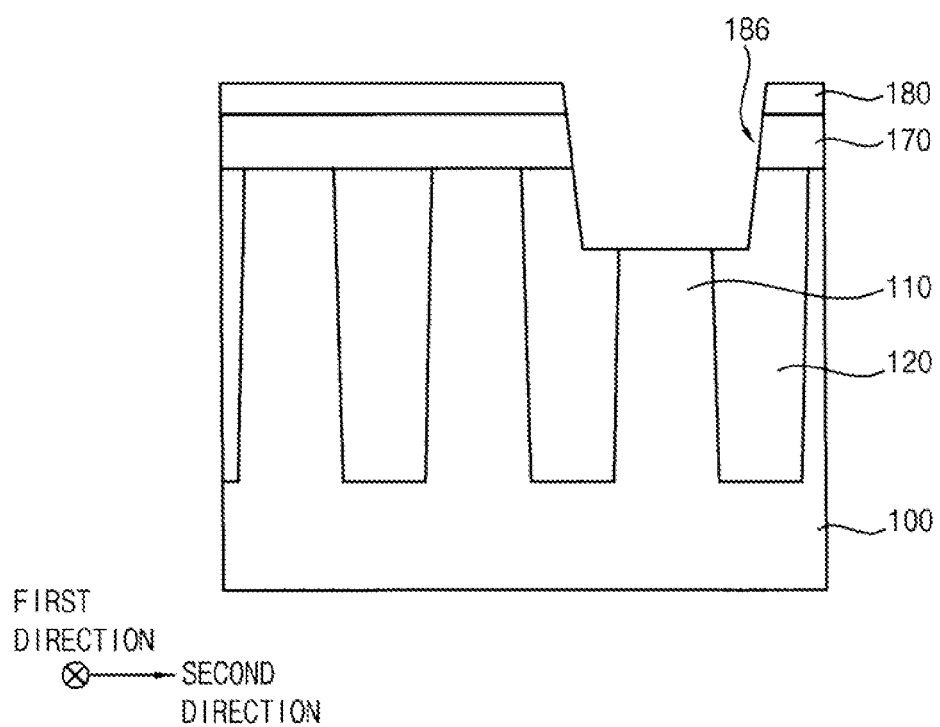

Referring to FIGS. 24 and 25, processes substantially the same as or similar to those described with reference to FIGS. 4 to 9 may be performed. That is, an isolation layer 120 may be formed on a substrate 100, to define an active pattern 110. Upper portions of the substrate 100 and the isolation layer 120 may be removed to form a second trench 125, and then gate structure that includes a gate insulation layer pattern 130, a gate electrode 140, and a gate mask 150 may be formed to fill the second trench 125. A first insulating interlayer 170 and a second insulating interlayer 180 may be formed on the substrate 100, the isolation layer 120 and the gate structure, and then a first recess 186 exposing a first region 112 of the active pattern 110 may be formed.

Figure 26:
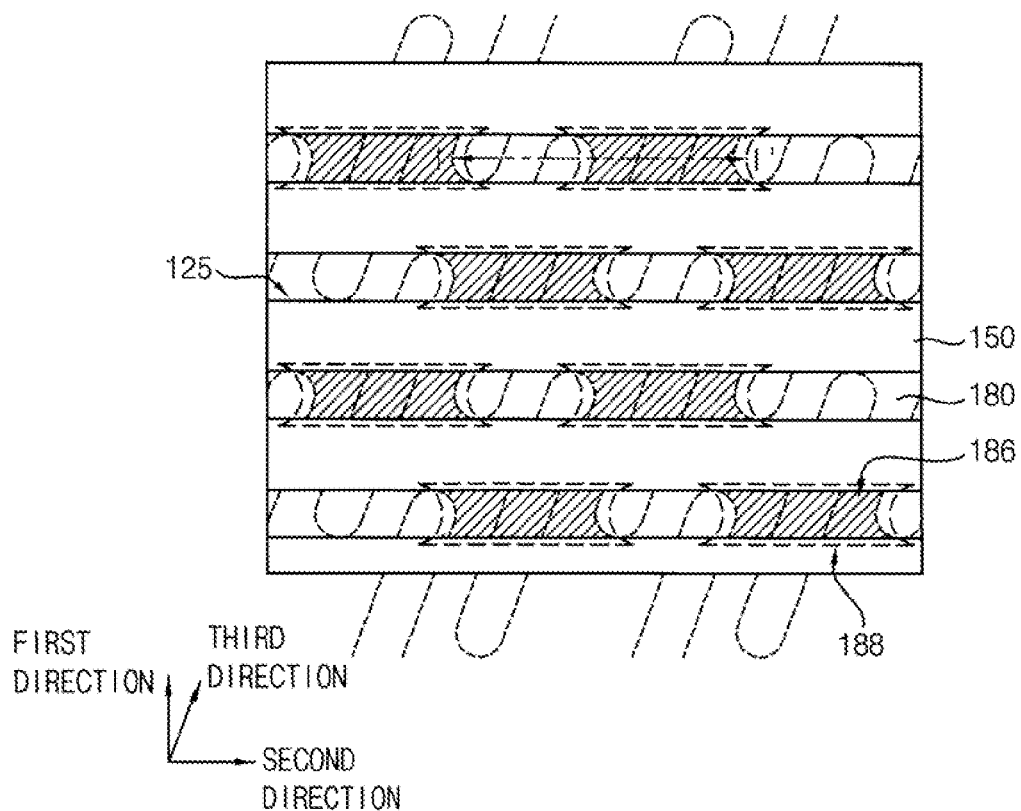
Figure 27:
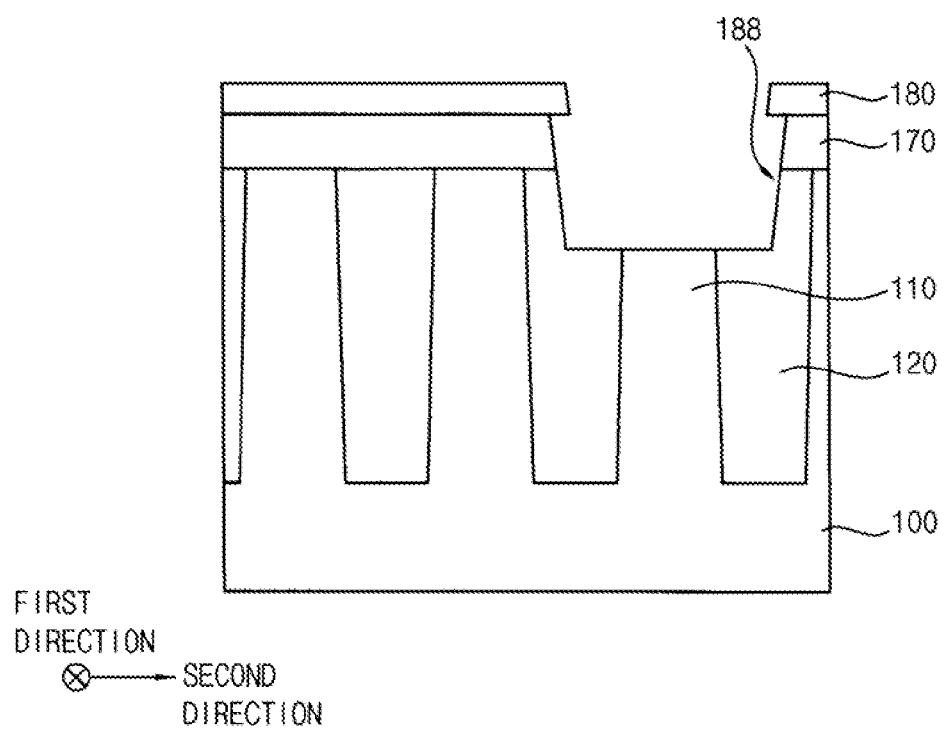

Referring to FIGS. 26 and 27, portions of the active pattern 110, the isolation layer 120 and the first insulating interlayer 170 exposed by the first recess 186 may be removed to form an enlarged first recess 188. The etching process may be substantially the same as those described with reference to FIGS. 12 and 13.

Figure 28:
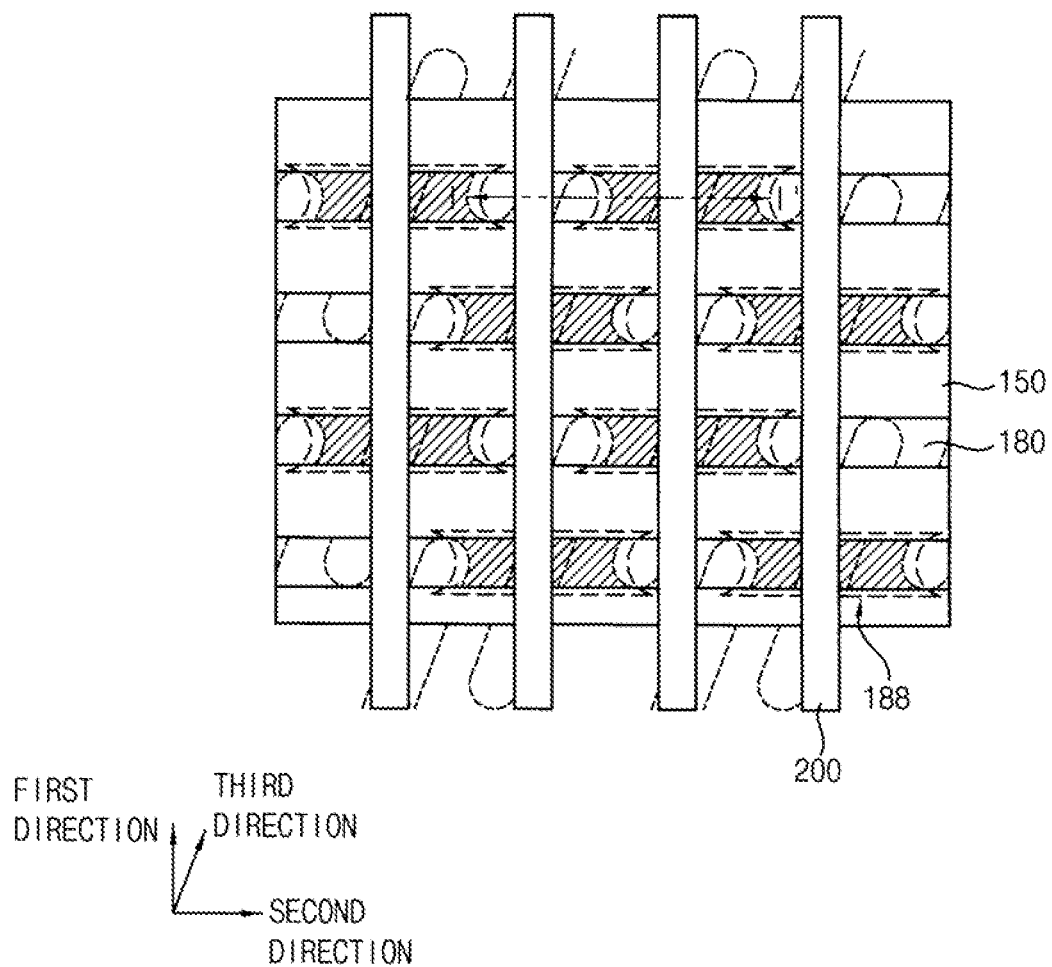
Figure 29:
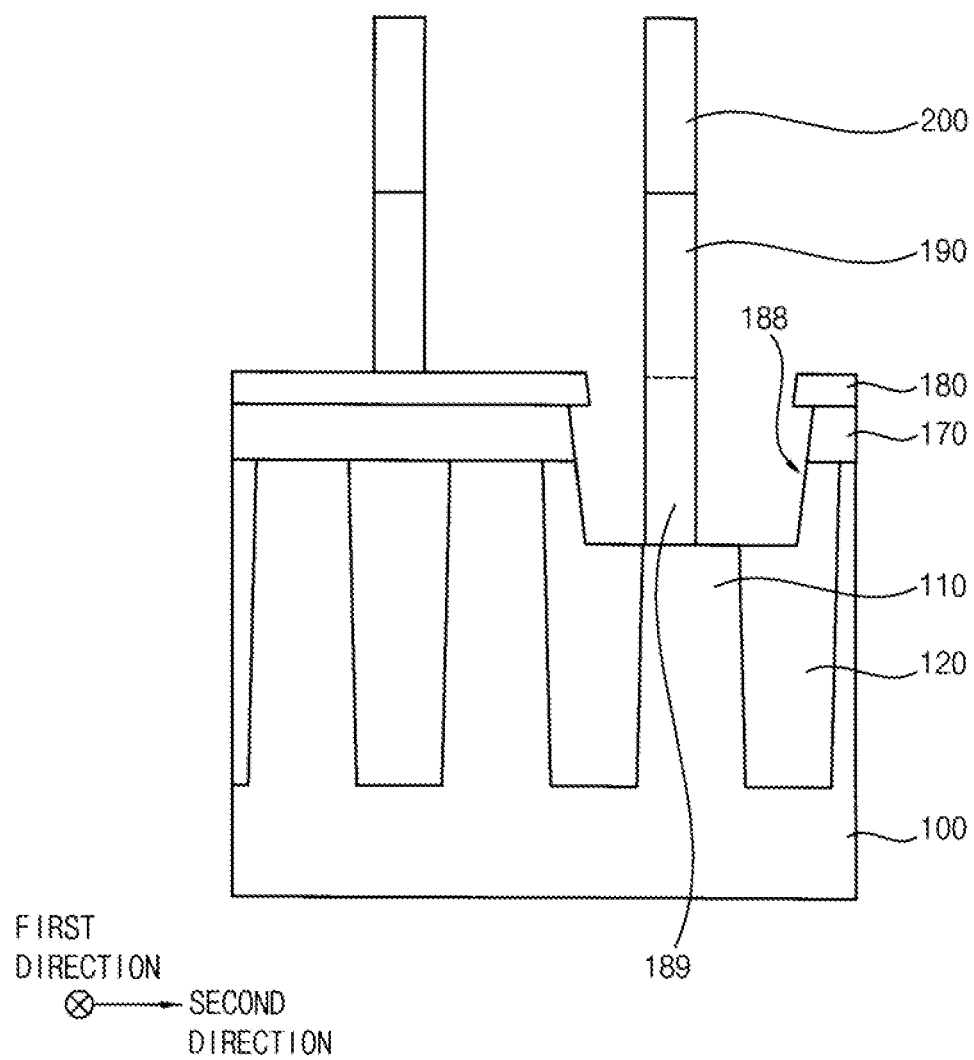

Referring to FIGS. 28 and 29, a first contact 189, a bit line 190 and a hard mask 200 may be formed on the substrate 100 in the enlarged first recess 188 and on the second insulating interlayer 180. The process may be substantially the same as those described with reference to FIGS. 10 and 11.

Then, by performing processes substantially the same as those described with reference to FIGS. 14 and 23, a semiconductor device may be completed.

Figure 30:
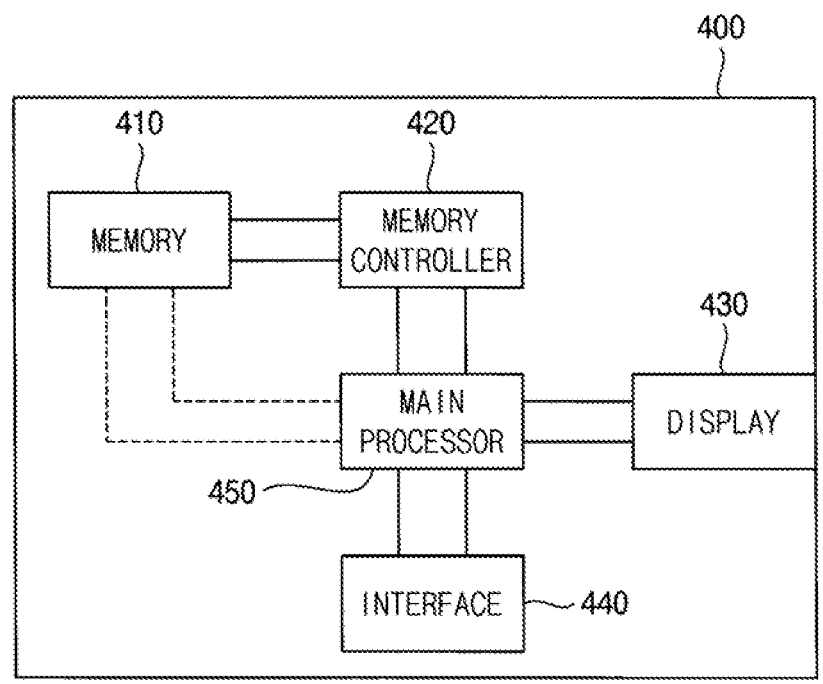
FIG. 30 is a block diagram of a system that includes a semiconductor device in accordance with exemplary embodiments.

FIG. 30 is a block diagram of a system that includes a semiconductor device in accordance with exemplary embodiments.

Referring to FIG. 30, a system 400 may include a memory 410, a memory controller 420 that controls the operation of the memory 410, a displaying part 430 that outputs information, an interface 440 that receives information, and a main processor 450 that controls the above described parts. The memory 410 may be a semiconductor device in accordance with exemplary embodiments. The memory 410 may be directly connected to the main processor 450 or through a bus. The system 400 may be used with, e.g., a computer, a portable computer, a laptop computer, a personal portable terminal, a tablet, a cellular phone, a digital music player, etc.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:
    forming an isolation layer on a substrate, wherein an active pattern is defined, the active pattern including a material substantially the same as that of the substrate;
    forming an insulating interlayer on the active pattern of the substrate and the isolation layer;
    removing portions of the insulating interlayer, the active pattern and the isolation layer to form a first recess;
    forming a first contact in the first recess on a first region of the active pattern exposed by the first recess;
    removing portions of the active pattern and the isolation layer exposed by the first recess by performing an isotropic etching process, to form an enlarged first recess; and
    filling the enlarged first recess to form a first spacer that surrounds a sidewall of the first contact.

2. The method as claimed in claim 1, further comprising:
    forming a bit line on the first contact and the insulating interlayer, wherein the bit line extends parallel to a top surface of the substrate in a first direction; and
    forming a plurality of second spacers that surround a sidewall of the bit line.

3. The method as claimed in claim 2, wherein forming the enlarged first recess is performed after forming the first contact and forming the bit line.

4. The method as claimed in claim 2, wherein forming the enlarged first recess is performed before forming the first contact and forming the bit line.

5. The method as claimed in claim 2, wherein the first spacer has a first width in a second direction perpendicular to the first direction, the second spacer has a second width in the second direction, wherein the first width is greater than or equal to the second width.

6. The method as claimed in claim 2, wherein filling the enlarged first recess to form the first spacer includes:
    forming a first insulation layer on an inner wall of the enlarged first recess, a sidewall of the first contact, and a top surface of the insulating interlayer;
    forming a second insulation layer on the first insulation layer; and
    removing upper portions of the first insulation layer and the second insulation layer.

7. The method as claimed in claim 6, wherein the first insulation layer includes silicon oxide, and the second insulation layer includes silicon nitride.

8. The method as claimed in claim 7, further comprising:
    removing portions of the insulating interlayer, the active pattern and the isolation layer by an anisotropic etching process to form a second recess between the second spacers, wherein the second recess exposes a second region of the active pattern, and
    removing portions of the insulating interlayer, the active pattern and the isolation layer by an isotropic etching process to enlarge the second recess.

9. The method as claimed in claim 8, wherein an etching solution used by the isotropic etching process has an etch rate with respect to the silicon nitride that is less than the etch rate with respect to the silicon oxide.

10. The method as claimed in claim 8, further comprising:
    filling the enlarged second recess with a second contact; and
    forming a capacitor electrically connected to the second contact.

11. A method of manufacturing a semiconductor device, comprising:
    removing portions of an insulating interlayer, an active pattern and an isolation layer on a substrate to form a first recess, the active pattern including a material substantially the same as that of the substrate;
    forming a first contact in the first recess on a first region of the active pattern exposed by the first recess;
    forming a bit line on the first contact and the insulating interlayer, wherein the bit line extends parallel to a top surface of the substrate in a first direction;
    removing portions of the active pattern and the isolation layer in the first recess by performing an isotropic etching process, to form an enlarged first recess;
    filling the enlarged first recess to form a first spacer that surrounds a sidewall of the first contact; and
    forming a plurality of second spacers that surround a sidewall of the bit line.

12. The method as claimed in claim 11, further comprising forming the isolation layer is on a substrate, wherein the active pattern is defined; and forming the insulating interlayer on the active pattern of the substrate and the isolation layer.

13. The method as claimed in claim 11,
    wherein filling the enlarged first recess to form the first spacer includes:
    forming a first insulation layer on an inner wall of the enlarged first recess, a sidewall of the first contact, and a top surface of the insulating interlayer;
    forming a second insulation layer on the first insulation layer; and
    removing upper portions of the first insulation layer and the second insulation layer, and further comprising:
    removing portions of the insulating interlayer, the active pattern and the isolation layer by an anisotropic etching process to form a second recess; and
    removing portions of the insulating interlayer, the active pattern and the isolation layer by an isotropic etching process to enlarge the second recess, wherein an etching solution used by the isotropic etching process has an etch rate with respect to the second insulation layer that is less than the etch rate with respect to the first insulation layer.

14. The method as claimed in claim 11, wherein forming the enlarged first recess is performed after forming the first contact and forming the bit line.

15. The method as claimed in claim 11, wherein forming the enlarged first recess is performed before forming the first contact and forming the bit line.

16. The method as claimed in claim 11, wherein the first spacer has a first width in a second direction perpendicular to the first direction, the second spacer has a second width in the second direction, wherein the first width is greater than or equal to the second width.

* * * * *